US006441658B1

(12) United States Patent
Taraci et al.

(10) Patent No.: US 6,441,658 B1
(45) Date of Patent: Aug. 27, 2002

(54) METHOD AND APPARATUS FOR VERTICALLY LOCKING INPUT AND OUTPUT SIGNALS

(75) Inventors: Brian Richard Taraci, Foothill Ranch; Duy Duc Truong, Fontana, both of CA (US)

(73) Assignee: RGB Systems, Inc., Anaheim, CA (US)

( * ) Notice: Subject to any disclaimer, the term of this patent is extended or adjusted under 35 U.S.C. 154(b) by 0 days.

(21) Appl. No.: 09/930,749

(22) Filed: Aug. 14, 2001

Related U.S. Application Data

(63) Continuation of application No. 09/648,793, filed on Aug. 26, 2000, now Pat. No. 6,316,974.

(51) Int. Cl.[7] ................................................ H03L 7/06
(52) U.S. Cl. ...................................... 327/147; 348/194
(58) Field of Search ................................ 327/146, 147, 327/149, 150, 151, 155, 156, 159, 160, 158, 166, 153; 386/17, 28, 41, 84; 348/194, 505, 540, 547

(56) References Cited

U.S. PATENT DOCUMENTS

| 4,405,945 A | * | 9/1983 | Sato ............................ 327/98 |
| 4,876,596 A | | 10/1989 | Faroudja ..................... 348/450 |
| 4,967,271 A | | 10/1990 | Campbell et al. ........... 348/701 |
| 4,982,280 A | | 1/1991 | Lyon et al. .................. 348/448 |
| 4,989,090 A | | 1/1991 | Campbell et al. ........... 348/451 |
| 5,162,910 A | | 11/1992 | Willis .......................... 348/521 |
| 5,610,661 A | | 3/1997 | Bhatt .......................... 348/446 |
| 5,673,006 A | | 9/1997 | Reinhardt .................... 331/103 |
| 5,889,439 A | | 3/1999 | Meyer et al. ................ 331/117 |
| 5,796,015 A | | 11/1999 | Day et al. .................... 709/226 |
| 6,078,595 A | | 6/2000 | Jones et al. .................. 370/503 |
| 6,316,974 B1 | * | 11/2001 | Taraci et al. ................. 327/147 |

FOREIGN PATENT DOCUMENTS

| EP | 0 647 933 | 4/1995 |
| EP | 0 875 882 | 11/1998 |

OTHER PUBLICATIONS

JP 09 233433 (Tokia Takashi) Sep. 5, 1997 (abstract), Patent Abstracts of Japan, Jan. 30, 1998, vol. 1998, No. 1, European Patent Office.

(List continued on next page.)

Primary Examiner—Timothy P. Callahan
Assistant Examiner—Linh Nguyen
(74) Attorney, Agent, or Firm—The Hecker Law Group

(57) ABSTRACT

This invention describes a method and apparatus for vertically locking input and output video frame rates. The output vertical sync pulse is locked in phase with the input vertical sync pulse, regardless of the input format and frequency. The output resolution, horizontal refresh rate, and delay are all user selectable. Two Phase Locked Loops are connected in series to achieve vertical lock between the input and output frames. Locking the vertical sync pulses between the input and output frames will eliminate mixing of pixels from different input frames in one output frame. The first Phase Locked Loop generates the output pixel clock required to satisfy the user's display preferences but may not precisely represent the desired output pixel clock required for frame locking because current Phase Locked Loops use integer dividers. A second Phase Locked Loop adjusts its output, which is the reference frequency to the first Phase Locked Loop, until a lock is achieved. A free running oscillator measures the frequency of the incoming video and sends its output to a micro-controller that computes the divider required in the Phase Locked Loop based on user selected output resolution. The user may also adjust the delay between the vertical input and output video frames.

27 Claims, 12 Drawing Sheets

OTHER PUBLICATIONS

Putman, Peter, H., "Shakin' the Scaffolds," Nov. Video Systems, 1999, available from {http://www.folsom.com}.

Lindstrom, Robert L., "Teaching Tech • Ed Tech–Heads," AV Video Multimedia Producer, Sep. 1999, {http://www.av-video.com}.

"ScreenMaster Supported Devices (Folsom VFC–2200)," Vista Control Systems Corp., {http://www.vistacontrol.com/folsom.html} (visited Aug. 3, 2000).

"Vista's ScreenMaster Series," Vista Control Systems Corp., {http://www.vistacontrol.com/screenmaster_series.html} (visited Aug. 3, 2000).

"Staging," {http://www.folsom.com/Product_page/Staging/staging.htm} (visited Aug. 3, 2000).

Hewins, Craig R., "Folsom Aids Windows 2000 Launch," VideoSystems, Mar. 2000.

"Staging and Corporate Theatre," {http://www.folsomresearch.com/Product_page/video/VFC–2200/vfc–2200.htm} (visited Aug. 3, 2000).

"2200 Features," {http://www.folsomresearch.com/Product_page/video/VFC–2200/2200_Features/2200$_{13}$ features.htm} (visited Aug. 3, 2000).

"2200 Tech," {http://www.folsomresearch.com/Product_page/video/VFC–2200/2200Tech/2200tech.htm} (visited Aug. 3, 2000).

"2200 Specifications," {http://www.folsomresearch.com/Product_page/video/VFC–2200/2200Specifications/2200_specifications.htm} (visited Aug. 3, 2000).

"2200 Applications," {http://www.folsomresearch.com/Product_page/video/VFC–2200/2200_Applications/2200_applications.htm} (visited Aug. 3, 2000).

"Seamless Switcher," {http://ww.analogway.com/gamme/seamles/gseam.htm} (visited Aug. 3, 2000).

"Graphic Switcher," {http://www.analogway.com} (visited Aug. 3, 2000).

"SynchroMaster 450," {http://www.rgbspectrum.com/Webpages/prodpgs/sm450.html} (visited Aug. 3, 2000).

"The Revolution in Switching is Here," RGB Spectrum, {http://www.rgb.com}.

"Media Wall," {http://www.rgbspectrum.com/Webpages/prodpgs/mwall.html} (visited Aug. 3, 2000).

"Scalers, Interpolators, Synchronizers," {http://www.rgbspectrum.com/Webpages/prodcats/scalers.html} (visited Aug. 3, 2000).

"ComputerWall," RGB Spectrum, {http://www.rgbspectrum.com/Webpages/prodpages/cwall.htm} (visited Aug. 3, 2000).

"PLL Design," {http://members.iinet.net.au/~richardh/PLL.htm} (visited Aug. 10, 2000).

"The Video Productivity Series," Jun. 2000, Folsom Research, Rancho Cordova, CA, {http://www.folsom.com}.

* cited by examiner

METHOD AND APPARATUS FOR VERTICALLY LOCKING INPUT AND OUTPUT SIGNALS

The present application is a Continuation of application Ser. No. 09/648,793, filed Aug. 26, 2000, now U.S. Pat. No. 6,316,974.

BACKGROUND OF THE INVENTION

1. Field of the Invention

This invention relates to the field of analog and digital signal processing, and more specifically to circuitry and systems for providing switching, scan conversion, scaling, and processing where the output frequency is different from the input frequency.

2. Background Art

Switches are a means of connecting an input source to an output device or a system. Typically, a switcher allows a user to provide an output derived from a selection between more than one input signal source or connector type. Furthermore, various types of switches have various components, capabilities, options and accessories.

2.1 Graphics Environment

For digital display technologies, a Graphic Switcher (GS) is a device that enables multiple analog and digital input signals to be selected and sent to various selected output devices, such as presentation displays. FIG. 1 illustrates a typical graphics environment showing various pieces of digital display technology connected by a graphics switcher, in accordance with an embodiment of the present invention.

Hence, a graphics switcher 100 allows source signals derived from inputs such as video cameras 102, VCRs 104, DVDs 106, TV video, audio/video systems, and computers 110, 112, and 114 to be selected and viewed on a presentation display 120 one at a time. For example, when trying to display from two computer inputs 110 and 114 having separate presentations, a graphics switcher 100 can physically connect both of the computers to the display device and allow input selection from the two computers for display on the display device 120. Other examples of graphics switcher use are for generating special graphics and movie effects; in industrial settings or security applications for switching between video cameras inputs for displaying certain areas on monitors or systems of display devices.

Typical inputs to a graphics switcher comprise computers, TV video, composite video, red-green-blue (RGB) video, S-Video, D-1 (digital) video, computer input (e.g. VGA, SVGA and Mac video formats), video cameras, VCRs, and various other audio/video inputs as appropriate. Furthermore, inputs may original from different physical locations. For instance, to form a presentation on a large screen display, a switch may be used to choose between inputs received from a computer at one end of one room, a computer in another room, a video camera taking video of a performance, and a video conferencing system.

Similarly, a switcher provides output to various sources or presentation formats. Examples of outputs comprise LCD panels (including high-resolution LCD projectors), DLP displays (including high-resolution DLP projectors), high resolution plasma displays, TV displays, CRT display devices 122 and 124 (e.g. VGA, SVGA and Mac video formats), audio stereo systems, and various other audio/video outputs as appropriate. For instance digital projectors used for business presentation supply digitally addressed elements to LCD panels, DLP panels, digital light processing devices, and various others.

A TV signal has a set number of horizontal lines. In PAL and SECAM, it's 625; in NTSC, it's 525. However, not all of these lines are visible. In fact, only 576 lines in PAL and SECAM and 483 lines in NTSC are seen by the TV viewer; the remainder are called blanking lines, which contain no picture information and are hidden at the top and bottom of the screen.

By contrast, the number of horizontal lines on a computer display can range dramatically, from lower resolutions of 480 visible horizontal lines or less, up to very high resolutions with 1280 or more lines. Many computers contain video cards that allow the user to choose between several different display resolutions.

The higher the display resolution, the more crisp and clear small details and text become. For example, a computer screen composed of 768 horizontal lines is able to contain and display more detail than a computer picture composed of only 480 lines, or a TV picture composed of 576. The relatively small number of horizontal lines in a TV video picture limits the ability to display very small text or other intricate visual details.

TV video is defined by either the NTSC, PAL or SECAM standard, which dictates the number of lines in the picture, how the color information is defined and the speed with which the lines are painted on the screen from top to bottom (refresh rate). However, within PAL, NTSC, and SECAM, there are actually several signal formats that meet these standards. Composite video is the most commonly used format. In composite video, all the video information (e.g. information for red, green, blue (RGB) and sync) are all combined into a single signal. S-Video, which provides a superior picture quality, separates the chrominance (color) from the luminance and sync information. Other variations of PAL and NTSC include RGB at 15 kHz, component video and D-1 (digital) video.

While all of these formats differ in the way the video information is combined into a signal, they still have certain things in common. They are all interlaced, they have either 576 (PAL and SECAM) or 483 (NTSC) visible lines, and they have an established, unvarying refresh rate. For PAL, two interlaced fields, making up a single "frame", are painted onto the screen 25 times each second (a rate of 25 Hz), and for NTSC, this occurs 30 times each second (30 Hz).

Unlike TV video, there is no single standard by which all computer video signals must abide. As discussed earlier, there is a wide range of commonly used display resolutions. There is an equally wide range of refresh rates, most falling between 60 and 85 Hz. And, while almost all computer displays are non-interlaced, some video display cards do offer an interlaced display option. However, what computer video signals do all have in common is the way in which they describe chrominance and luminance information to the monitor. All VGA, SVGA and Mac video formats transmit the red, green and blue information as separate signals. But, there is some variation between computers, in the way sync information is combined with the color signals. By keeping red, green and blue separate from each other, computer monitors are able to display a wide range of colors with minimal distortion.

2.2 Types of Switchers

In order to support such a wide variety of analog and digital inputs and outputs, numerous types and "lines" of switchers have been developed. For example, there are audio/video (A/V) switches; VGA, Mac and RGB switchers; system switchers; and matrix switchers. In addition, the numerous signal characteristics associated with switching mixtures of inputs to outputs has led to number of switch options and accessories.

For instance, a line of A/V switchers may accept NTSC/PAL/SECAM composite and S-video type video sources, as well as two channels of stereo audio from amongst six selectable inputs. Each model in the line is then differentiated by the type or combinations of video audio formats that it accepts.

Another line of switchers, VGA, Mac and RGB switchers, are used for simple routing applications. A model of this line can be dedicated to switching signals of only one specific computer type, such as VGA or Mac. Alternatively, another model may provide more input flexibility, by accepting both VGA and Mac video signals.

A more complex switcher type, the system switcher, may be compatible with all types of digitally controlled projectors and accept virtually all source signals. Thus, a system switcher can easily switch between computers, A/V components and audio sources. In addition, an accessory may allow a system switcher to communicate with a projector and be recognized by the projector as if the switcher were the same brand as the projector.

A special type of switcher, the matrix switcher, routes multiple inputs to multiple outputs. For example, input #1 (e.g. camera 102) can be routed to output #1 (e.g. preview monitor 124) or output #2 (e.g. program monitor 122); input #2 (e.g. PC computer 110) can be routed to output #3 (e.g. program monitor 122) and #4 (e.g. digital display 120); and so on—in any combination. Thus, a matrix graphics switcher may allow for the switching of multiple inputs and outputs in most video and RGB formats. Matrix switchers are commonly used in applications such as presentations, data display, and entertainment. These applications require multiple input sources (computers, cameras, DVD players, etc.) to be switched to more than one output destination (monitor, projector, videoconferencing CODEC). Addition of an auto-switching accessory allows such switchers to automatically switch between various types of inputs, and/or outputs when a change in input signal type is detected. Thus, a switcher may have various signal conversion and processing capabilities depending on switcher type and needs. For example, graphics switchers implement mixture of scan conversion, scaling, filtering, and other capabilities as needed for their desired performance.

A scaler changes the size of an image without changing its shape, for instance, when the image size does not fit the display device. Therefore, the main benefit of a scaler is its ability to change its output rate to match the abilities of a display device. This is especially advantageous in the case of digital display devices because digital display devices produce images on a fixed matrix and in order for a digital display device to provide optimal light output, the entire matrix should be used. FIG. 2 illustrates a digital display device showing the pixel matrix for displaying an image according to an embodiment of the present invention. Thus, the goal of a scaler is to have output flexibility so that the input image can be scaled to an output image 202 that matches the pixel matrix 204 of the display device 206 or the display "sweep spot".

Since a scaler can scale the output both horizontally and vertically, it can change the "aspect ratio" of an image. Aspect ratios are the relationship of the horizontal dimension to the vertical dimension of a rectangle. Thus, when included as part of a graphics switch, a scaler can adjust horizontal and vertical size and positioning, for a variety of video inputs. For example, in viewing screens, the aspect ratio for standard TV is 4:3, or 1.33:1; HDTV is 16:9, or 1.78:1. Sometimes the ":1" is implicit making TV=1.33 and HDTV=1.78. So, in a system with NTSC, PAL or SECAM inputs and a HDTV type of display, a scaler can take the standard NTSC video signal and convert it to a 16×9 HDTV output at various resolutions (e.g. 480 p, 720 p, and 1080 p) as required to fit the HDTV display area exactly.

Scaling is often referred to as "scaling down" or "scaling up." An example of "scaling down" is when a 640×480 resolution TV image is scaled for display as a smaller picture on the same screen, so that multiple pictures can be shown at the same time (e.g. as a picture-in-picture or "PIP"). Scaling the original image down to a resolution of 320×240 (or ¼ of the original size) allows four input TV resolution pictures to be shown on the same output TV screen at the same time. An example of "scaling up" is when a lower resolution image (e.g. 800×600=480,000 pixels) is scaled for display on a higher resolution (1024×768=786,432 pixels) device. Note that the number of pixels is the product of the two resolution numbers (i.e. number of pixels= horizontal resolution×vertical resolution). Thus, when scaling up, pixels must be created by some method. There are many difference methods for image scaling, and some produce better results than others.

A scan converter is a device that changes the scan rate of a source video signal to fit the needs of a display device. For instance, a "video converter" or "TV converter" converts computer-video to NTSC (TV), or NTSC to computer-video. Although the concept seems simple, scan converters use complex technology to achieve signal conversation because computer signals and television signals differ significantly. As a result, a video signal that has a particular horizontal and vertical frequency refresh rate or resolution must be converted to another resolution or horizontal and vertical frequency refresh rate. For instance, it requires a good deal of signal processing to scan convert or "scale" a 15 KHz NTSC standard TV video input (e.g. 640×480) for output as 1024×768 lines of resolution for a computer monitor or large screen projector because the input resolution must be enhanced or added to in order to provide the increased capability or output resolution of the monitor or projector. Because enhancing or adding pixels to the output involves reading out more frames of video than what is being read in, many scan converters use a frame buffer or frame memory to store each incoming input frame. Once stored, the incoming frame can be read out repeatedly to add more frames and/or pixels.

Similarly, a scan doubler (also called "line doubler") is a device used to change composite interlaced video to non-interlaced component video, thereby increasing brightness and picture quality. Scan doubling is the process of making the scan lines less visible by doubling the number of lines and filling in the blank spaces. Also called "line-doubling". For example, a scan doubler can be used to convert an interlaced, TV signal to a non-interlaced, computer video signal. Hence, in order to display TV video on new TFT flap panel screens, a line doubler or quadrupler is indispensable.

2.3 Problems with Graphics Switchers

When a graphics switcher switches between input signals having disparate refresh rate frequencies or resolutions, either the switcher or the display needs to lock to the new vertical refresh rate and horizontal refresh rate. As a result when the input signal is switched and a signal having a new frequency is sent to the output display device, the display has to reacquire and lock up to the new frequency so the new input can be displayed. During the time it takes the display to reacquire the new input signal frequency, the output drifts leading to picture scrambling and/or noise which results in a "jitter" in the output display.

Accordingly, in order for a graphics switcher to provide a stable output, it must be capable of switching between multiple analog and digital input formats and resolutions while keeping the output rate and resolution stable. One way to design such a switch is to use signal processing.

2.4 Seamless Graphics Switchers

A switcher that provides such a stable output during switching is generally referred to as a Seamless Graphic Switcher (SGS). The term "seamless" derives from providing a glitch-free "cut" that eliminates the noise and jitter caused by switching between unsynchronized inputs. By using signal processing, the output is kept stable in an SGS while the input is switched between multiple analog and digital formats because the inputs are scan converted to one frequency before being sent to the display. Since the signal processor is doing the "locking" onto the new input rates, the display always sees the same resolution and has the same constant sync. Thus, because the display only receives one frequency, it does not have to reacquire the signal and thereby does not produce the jitter related to switching the input. Therefore, scan conversion signal processing permits the user to switch between inputs, without causing jitter in the output from input switching.

In order to scan convert the inputs to one frequency, a SGS writes the input to and reads the output from a memory buffer. Once stored, the incoming frame can be processed and/or read out repeatedly, to add more frames or pixels. Hence, using a memory buffer also allows an SGS to provide scaling (as previously described). In fact, seemless switching usually involves scaling and seamless switchers are usually comprised of two scalers and a matrix switcher.

For example, referring to FIG. 1, a prior SGS product 100 is capable of handling eight different input signals 130, includes routing and control functions for handling the signals, and provides scaling and synchronization ("sync") of the image to the selected output resolution. Thus, the SGS accepts RGB or component video signals with various scanning rates while the operator seamlessly switches those eight inputs to a fixed output rate that is selectable.

As such, the prior SGS can be used for staging events where high frequency computer video 110, 112 and 114 and standard frequency video from a camera 102 must be seamlessly switched to high frequency and high computer resolution outputs 120, 122 and 124. The prior SGS can accept both interlaced and non-interlaced video formats with resolutions from 560×384 up to 1600×1200 with scan rates of 15 kHz up to 100 kHz and provides two different output signals. The first output is the "program" output for viewing by the audience. The second output is the "preview" output for viewing "next to switch" sources by the switch operator on a local monitor. Thus, the switch operator can seamlessly switch the "preview" to the "program" output or choose a digital transition effect to use when the physical switch is made.

In order to optimize image quality as well as maintain maximum image brightness and detail, all inputs are scaled to resolutions that match the "sweet spot" or native resolution of digital displays. Advanced digital video scaling technologies enable the example SGS to scale RGB inputs to one of eighteen common computer-video, HDTV, or plasma resolutions. These scaled output resolutions for computer-video output rates are 640×480, 800×600, 832× 624, 1024×768, 1280×1024, and 1360×1024. For plasma displays, the output resolutions are 848×480, 852×480, 1280×768, and 1360×765. The SGS also provides HDTV 480p, 720p, 1080i, and 1080p output rates.

2.5 Problems with Seamless Graphics Switchers

Nevertheless, although SGSs solve the graphics switcher new input "jitter" problem, there is an inherent problem with SGSs that use a frame buffer or memory to convert an input video signal with one horizontal and vertical frequency refresh rate to an output with another horizontal and vertical refresh rate. As each input frame comes in, the SGS stores that entire frame internally in a box in the memory, which allows the SGS to signal process or read that frame out repeatedly.

However, if the output vertical read rate from the memory buffer is not an integer multiple of the input vertical write rate to the memory, the information in output frame will contain two different input frames at some point in time. As a result, part of the output display will show the image from one input frame, while the rest of the output display shows the image from the second input frame. If there is motion in the input images, elements in the two input frames will be different and therefore, the output frame will display part of one image (e.g. a portion of the "before" image) and part of a later image (e.g. a portion of the "after" image). Moreover, at the border between the two images, a "tear" will appear in the output. FIG. 3 illustrates a digital display output image having a "tear", according to an embodiment of the present invention.

Thus, for instance, input of a ball that is moving horizontally from right to left 300 will result in the top part of the output frame showing the image from the second input frame 302, while the bottom part of the output frame shows the image from the first input frame 304, and a tear in the image where the two parts of the output frame meet 306. The image in the top portion of the output is shifted to the left of that in the bottom portion of the output because the top portion is an image from later in time while the object moves from right to left. Note that there is also a horizontal pixel shift in the output image at the point where the read and write pointers cross over 310.

Thus, current SGSs have a particular problem when the input images contain "panning". For instance, a lot of camera panning is necessary during an on-stage event where the cameras are tracking someone by following them around on the stage. Then, during the scan converting process, because different input frequencies are coming into the SGS and a different scan converted rate going out of the SGS, there are two different refresh rates for writing to and reading from the memory buffer. As a result, the vertical read and write rates are not locked in synchronization.

Describing what creates the output tear in another way, because each output frame being displayed is read from memory, when frames are being written to and read out of memory at different rates, the write pointer and read pointer moving along in memory at different rates. Hence, the read and write pointers will eventually cross, and when they cross, the read pointer will go from new input frame information just behind the write pointer to old input frame information that the write pointer was about to write over. The new and old input frame information will then be combined in the current output frame, and if there is movement in the input (e.g. sideways panning) then output will include a tear where the read pointer crossed the threshold between the newer and older input frames.

When the vertical frame refresh rate coming in and the vertical refresh rate going out cross, or "vertical syncs" cross a tear is formed. When they cross, as the input is being written into the frame memory, the two pointers in the memory actually cross, and as a result a single output frame is displayed having old input frame information and new input frame information.

Note that the tear produced in the output of SGS devices is a bigger problem in Europe where the output frame vertical frequency rate is usually 60 Hz and all of the input source vertical frequencies are usually 50 Hz, hence, because there is delta between the two vertical refresh rates of 10 Hz, European SGS applications can encounter the tear up to 10 times a second.

FIG. 4 is a waveform diagram of the input and output vertical sync pulse in an attempt (i.e. because the actual phenomenon can only be captured in a motion picture or a series of frames) to depict the result when the output vertical sync pulse is not locked with the input vertical sync pulse. Referring to FIG. 4, the top trace shows the vertical sync of the input signal 402. The bottom trace shows the vertical sync of the output signal 404. The sync pulses are depicted at points 406 for the output vertical sync and at point 408 for the input vertical sync. In reality, the output and input vertical sync pulses have different frequencies when there is no lock hence, when viewed together on an oscilloscope, there is a relative motion between the sync pulses.

Attempted Solutions

One option for solving the SGS output tear, is to take the input signal horizontal and vertical rates and exactly duplicate them at the output so that the frame rates are the same and the horizontal and vertical syncs are the same. The problem with this solution is that it prohibits scaling or scan conversion because the input and output pixel counts are exact equal.

For example, if the input rate is only 15 KHz video, then with the output horizontal and vertical rates locked to the input, the switch can only provide 15 KHz output. Thus, high resolution output video is not possible because 15 KHz interlaced output does not provide enough pixels for big screen projectors.

An additional attempt to solve the tear in SGS output frame during input movement is to use a Phase Locked Loop (PLL) to achieve synchronization between the output vertical sync pulse and the input vertical sync pulse. However, prior implementations of this method fail and the vertical frame rates do not end up synchronized leading to tears in the output. After a certain number of output frames, the output read pointer will cross the input write pointer and when it does, that output frame will still end up containing parts of two input images and a "tear" in between.

Another attempt at solving the SGS output tear is to add frame memory to sort of double buffer the input frames so that there are two input frame buffers containing consecutive input images. Then, whenever the vertical pointers cross, the output frame having two input images can be removed or replaced with the next single image frame. So, at any given instant one of the two buffers has only information from one input frame. Then, when the pointers cross, whichever buffer has information from just one input frame is output. The net effect is that the SGS actually drops a frame or double displays a single frame. The problem is that when an output frame is removed or replaced, the timing of the images is mixed up and any linear motion, such as during panning, will suddenly appear to either hesitates for a frame or jumps ahead for a frame because image information is missing.

For example, motion is not smooth anymore. Instead it includes jumps and hesitations. Thus, motion may appear to stop, then repeat, then jump or skip; or stop, then make a big jump, then stop, them make another big jump. Any panning or any motion in any direction on the screen that's moving at a constant velocity, will jump. Objects in motion will look like they hopped or stuttered. Or, stopped for a second and then continued. On a large screen projector, the image has "hick-ups", and it appears that something is wrong with the image.

Hence, if a user was attempting to record the SGS output at high speed and the SGS is dropping frames to avoid tears, the recording would be full of stutters. Also, if the frames were dropped during a broadcast or high definition display the output would appear unprofessional and sloppy. In addition this method causes variable output audio delay and skipping in parallel to that described for the output image.

Another attempt at solving the SGS output tear is to delay the output so that whenever the vertical pointers cross, signal processing can be performed to somehow "smooth over" the output frame having two input images. However, even with a delay, the output frame with a tear still exists and a frame or frame portion must still be dropped or added. Thus, when the output frame or a portion thereof is removed or replaced, the timing of the images is mixed up and any linear motion, will suddenly appear to either hesitate or jump ahead.

An additional problem with adding delays with SGSs is that video is often delayed at several points in a system due to signal processing steps that have frame delays or delays due to recording to memory. For example, in large staging events delays start to accumulate and can actually accumulate to the point where a speaker or singers lips are out of sync with the sound provided by the system. Generally, an entire system can get by with up to a one frame delay of audio to video, but past one frame and depending on the circumstances, the timing difference between the audio and output image lip sync is discernable.

Therefore, it is desirable to provide a system capable of locking the output vertical frame sync pulses to the input vertical frame sync pulses, while allowing for a different horizontal frequency in the output rate, and while maintaining a constant seamless output frequency and resolution during switching of inputs. For example, a desirable SGS is one where the read and the write pointers in memory do not cross, and it does not produce an output frame made up to two different input frames.

It is also desirable to provide a system wherein the output and input vertical sync pulses are locked, and the position of the output vertical frame read pointer in memory can be adjusted as compared to the position of the input vertical frame write pointer. For instance, a desirable SGS would allow the output read pointer to be placed at any point in reference to the input vertical pointer, so that for instance, frame rate delay could be adjusted (e.g. to say, half a frame). Thus, frame rate delay for an SGS could be set at, adjusted to, or programmed to change to one or more constant, predictable values as desired.

Such a SGS is also desirable because having the video delay locked at a specific value provides a predictable and constant delay for synchronizing the audio to the video. Thus, such an SGS allows for exact, predictable, and more precise video to audio synchronization.

Furthermore, it is desirable to provide a system with an adjustable position of the output vertical frame read pointer in memory as compared to the position of the input vertical frame write pointer so that output frame rate delay can be adjusted to near zero. For instance, a desirable SGS would allow the output vertical frame delay as compared to the input to be reduced as much as possible while still allowing the SGS to function.

Hence, although an SGS can not have a 0 delay unless it processes and outputs lines as they come in, an SGS can have near 0 delay if the input and output frame rates are locked together, and the read and write pointers adjustable as compared to each other. Then, at large staging events where the video is run through several delay causing processing and recording steps, accumulation of delay can be minimized. As a result, a very low frame delay large stage event system does not require an audio delay so that the audio lines up with the delayed video. Such a SGS is also desirable because the video delay can be minimized, thus allowing the audio offset to be minimal or if necessary allowing for a minimal required delay in audio for audio/video output synchronization.

SUMMARY OF THE INVENTION

This invention describes a method and apparatus for vertically locking input and output video frame rates. In one or more embodiments of the present invention, the output vertical sync is locked in phase with the input vertical sync, regardless of the input format and frequency. The output resolution, horizontal refresh rate, and delay are user selectable allowing the user to view video from any source and according to the user's desired preferences. Vertically locking the input and output frame rates assures that pixels from different input frames are not superimposed on one output frame.

In one embodiment, two Phase Locked Loops are connected in series. The first Phase Locked Loop generates the output pixel clock required to satisfy the user's display preferences. The first Phase Locked Loop may not precisely generate the desired output pixel clock required for frame locking because current Phase Locked Loops require integer divider values and the desired divider value may compute to a non-integer number. Therefore, the non-integer or fractional part in divider value is lost. However, a second Phase Locked Loop is used to compensate for the loss of the fractional part in divider value. The second Phase Locked Loop uses a Voltage Controlled Crystal Oscillator or an equivalent device with finite adjustment capability to generate the reference frequency for the first Phase Locked Loop. Hence, in one or more embodiments, the reference frequency is finitely adjustable until a lock is achieved.

In one or more embodiments, an output timing generator generates the horizontal and vertical sync pulses. The output vertical sync pulse is phase locked with the input vertical sync pulse. A free running oscillator measures the frequency of the incoming video and sends its output to a micro-controller that computes the divider required in the first Phase Locked Loop based on user selected output preferences. The user may also adjust the delay between the vertical input and output video frames through the output timing generator.

DETAILED DESCRIPTION OF THE INVENTION

Figure 1:
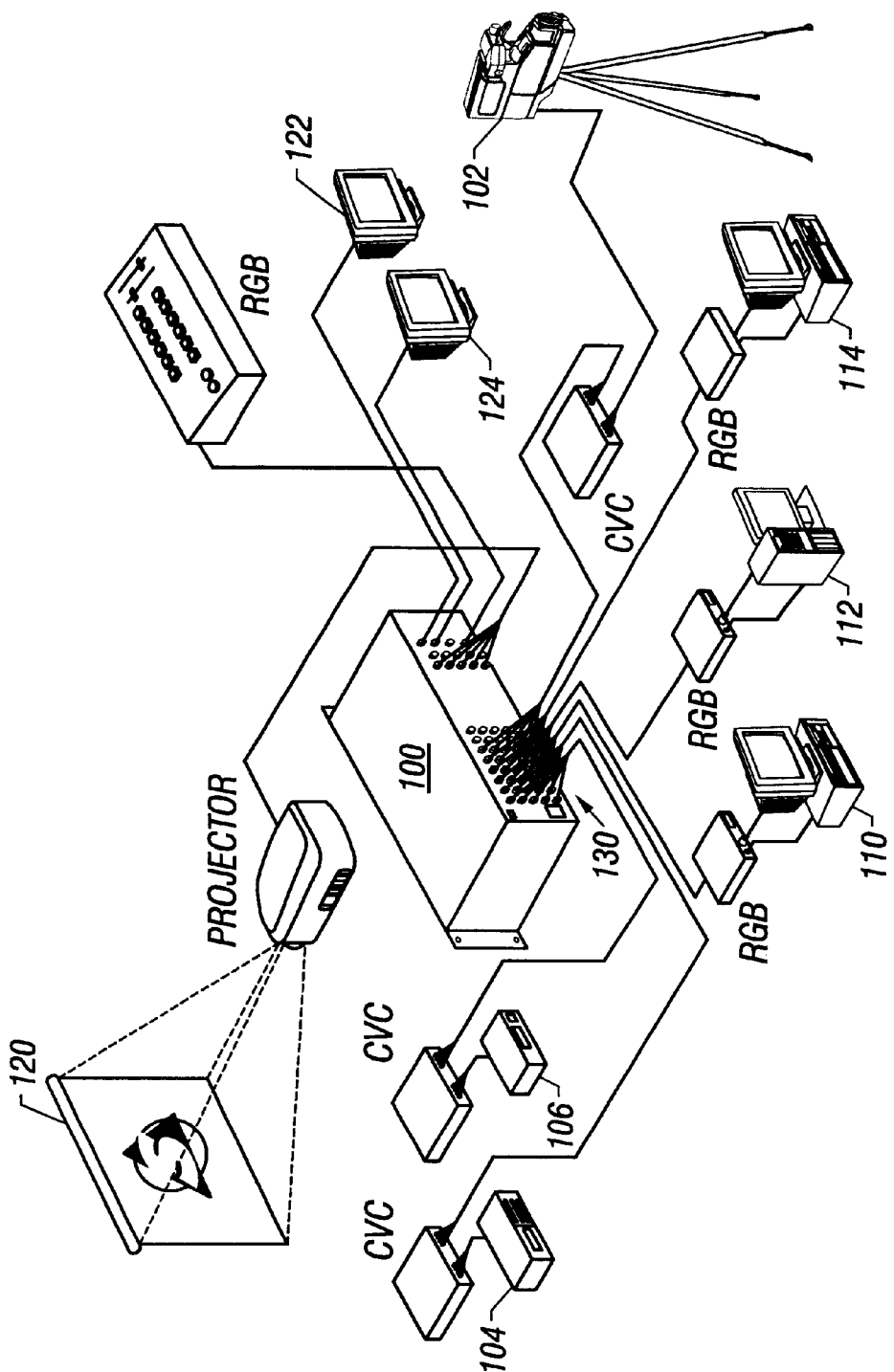
FIG. 1 illustrates a typical graphics environment showing various pieces of digital display technology connected by a graphics switcher, according to an embodiment of the present invention.
Figure 2:
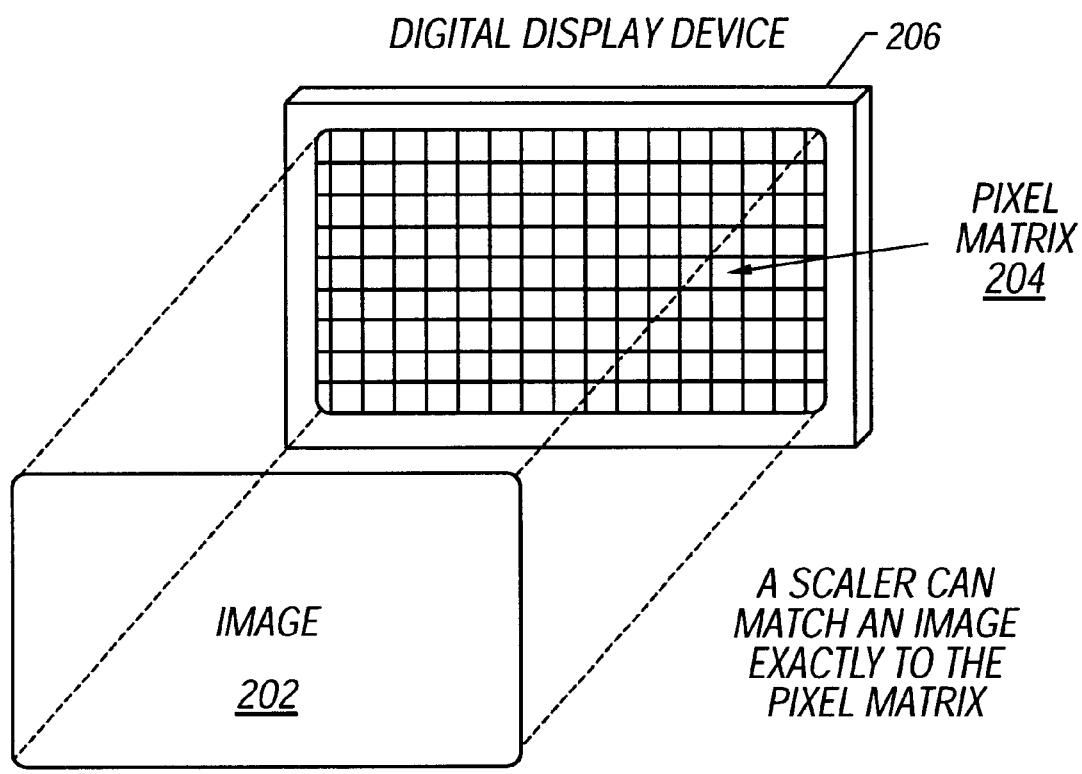
FIG. 2 illustrates a digital display device showing the pixel matrix for displaying an image, according to an embodiment of the present invention.
Figure 3:
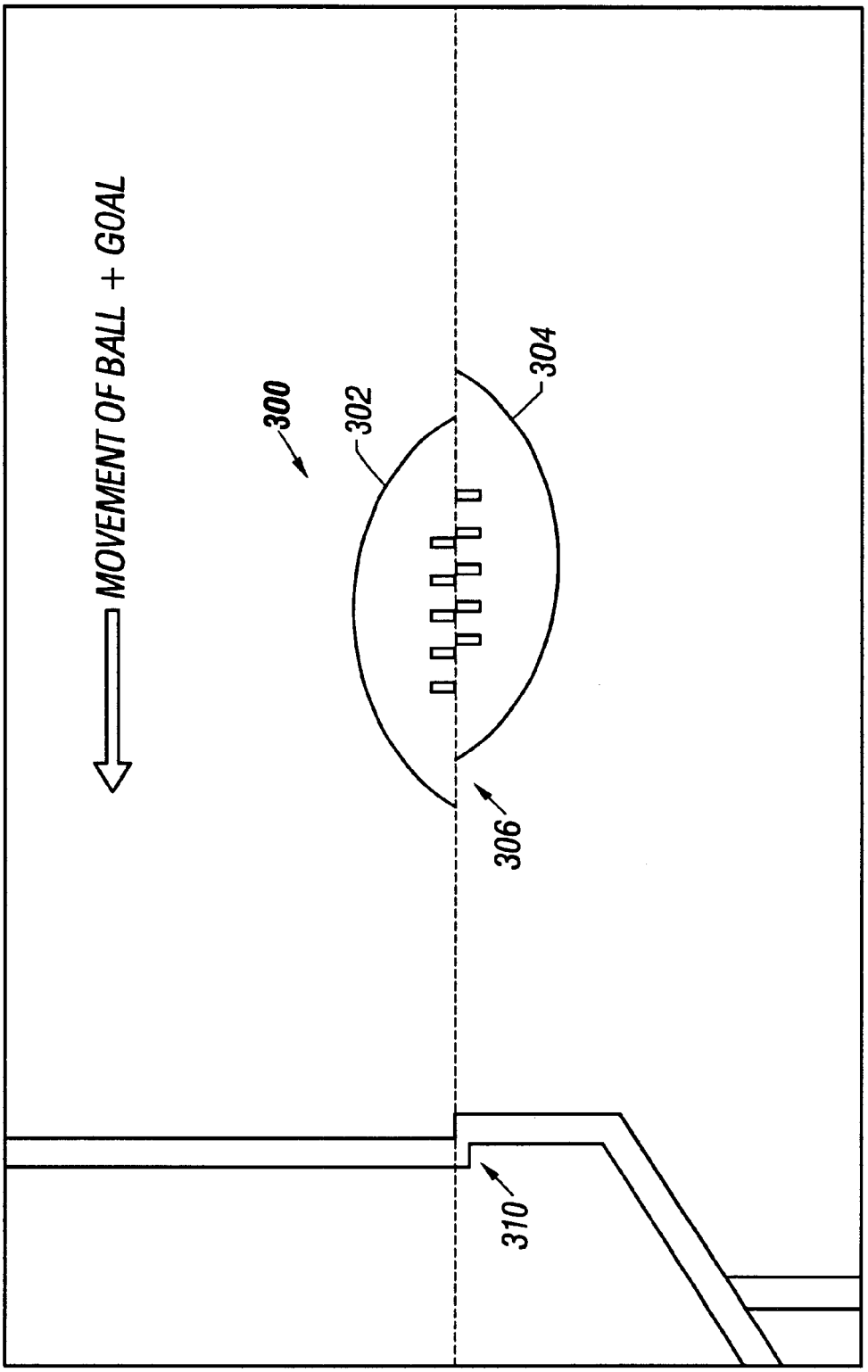
FIG. 3 illustrates a digital display output image having a "tear", according to an embodiment of the present invention.

The invention comprises a method and apparatus for vertically locking input and output signals from differing video sources. In the following description, numerous specific details are set forth to provide a more thorough description of embodiments of the invention. It will be apparent, however, to one skilled in the art, that the invention may be practiced without these specific details. In other instances, well known features have not been described in detail so as not to obscure the invention.

In one or more embodiments of the present invention, the apparatus and methods described herein provide the capability to lock the input and output video frame rates (i.e. frequency) at a user specified output resolution. In a typical application, videos from multiple sources arrive with differing frame rates and resolutions. These input video signals are scaled to match the output video requirement and are subsequently output at high rates to a display device. The desire is for the output resolution to be able to remain constant, at user preset values, while the input video sources vary both in resolution and timing.

The various methods for modifying the input video signal to desired output resolution include: video scaling, line doublers, and quadruplers. These methods are discussed in more detail in the background. However, whatever the desired output resolution, fuzziness may occur when switching between multiple video sources or when, for example, a camera is panned at a reasonable rate of speed. Because the input video data is written into memory before scaling occurs. If the writing and reading pointers are not synchronized, some sections of the display screen may have data from a different input frame from other sections of the display screen. The object of the present invention is to synchronize the input and output frame rates so that the picture associated with an entire input frame can be read and displayed at the output, and at the desired output resolution.

Typically, a Phase Locked Loop (PLL) is used to achieve synchronization. A PLL is a closed loop feedback system where the frequency of one signal (the sync pulses from the output to a frequency generator) is controlled by varying the input to a variable frequency generator so that it is locked in phase with the sync pulses from a reference source. This is accomplished by comparing the phase of a reference oscillator output with the phase of the output of a Voltage Controlled Oscillator (VCO) (where the VCO is the variable frequency generator) in order to generate a phase error signal. The error signal is conditioned and used to adjust the VCO until the frequency of the VCO matches the frequency of the reference oscillator.

A VCO can be swept over the frequency range of interest by a control voltage. The output of the VCO is the output of the PLL system, which is used as the clock for different applications. In a PLL, the VCO output is fed back through a programmable divider and compared with a reference frequency in a Phase Detector. The reference frequency is usually passed through a reference divider in practical applications. The reference is usually a crystal oscillator, VCXO (Voltage Controlled Crystal Oscillator), but might be the output of another PLL. The Phase Detector generates an error voltage that steers the VCO to lock the VCO output to the same frequency as the reference.

Figure 6:
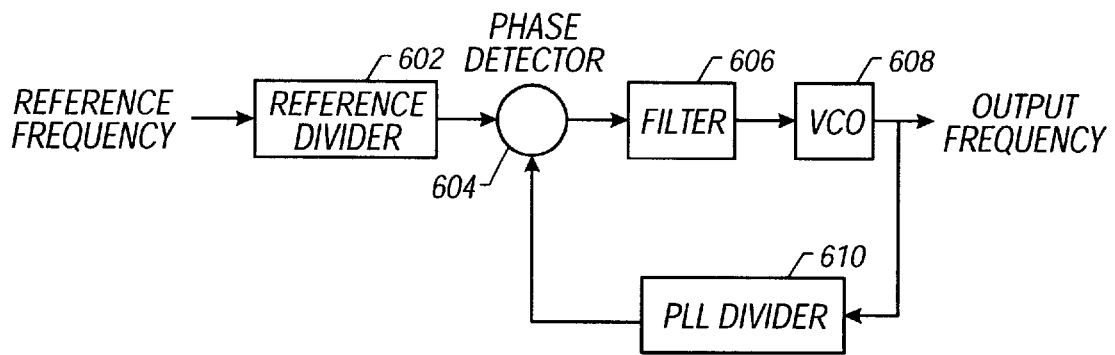
FIG. 6 is a block diagram of a typical phase locked loop.

FIG. 6 is a block diagram of typical phase locked loop. The input to the PLL is the output of a reference oscillator, usually a crystal oscillator, which is fed through a frequency divider at block 602 to generate the desired (i.e. reference) sync rate (i.e. frequency). The Phase Detector, block 604, compares output of the Reference Divider block, 602, with output of PLL Divider block 610 to generate the phase error between the two signals. Output of block 610 is the generated frequency from the Voltage Controlled Oscillator (VCO) block 608 divided by a PLL divider value. For loop stability, the phase error is filtered in block 606 before being used to adjust the VCO. When the loop stabilizes, the output of block 610 is locked in phase (i.e. there is no phase difference) with the reference output of block 602.

In a typical system, the VCO operates at a frequency an order of magnitude higher than the reference. For example, assuming a desired frequency step of 25 KHz and a crystal reference frequency of 4 MHz. In this case the reference divider will divide the crystal reference by 160 (4 MHz divide by 160=25 KHz). For a VCO output of (for example) 146.5 MHz the PLL Divider would be set at 5860 to divide 146.5 MHz down to 25 KHz. Thus when the loop is locked, the reference and VCO signals presented to the phase detector are both 25 KHz. Note that because of current hardware constraints, the PLL divider is an integer number (generated by a binary machine). However, it would be apparent to those of ordinary skill that this invention can be practiced with any PLL type device that allows for locking of the output frequency to a reference frequency.

The final component in the PLL system is the loop filter. This is necessary because a typical phase detector does not generate a "DC" error voltage but rather a pulsed waveform depending on the loop lock situation. For example the Motorola MC145170 PD output is a logic level signal with positive or negative going pulses (depending on how the chip is programmed). If this waveform were applied directly to the VCO a broad, frequency modulated signal would result. The loop filter integrates (or averages) the PD output to produce a smooth error voltage.

The phase detector may be integrated into the PLL chip along with programmable reference and main dividers and digital control circuitry. There are several possible embodiments of phase detector circuits. Most modern PLL chips use a charge pump circuit. The output of the charge pump is a logic level pulsed waveform, which is integrated to produce the VCO control signal. The loop filter integrates the pulsed output from the phase detector to produce a smoothed "DC" VCO control voltage. Varying the component values in the filter sets the PLL performance.

As discussed earlier, the PLL divider is an integer number. In that discussion, the numbers were conveniently chosen to produce integer numbers when the frequencies were scaled down for input into the phase detector. In practice however, integer numbers do not always result from the scaling effort, thereby causing lost precision. The lost precision may create problems that prevent the output of the VCO from truly locking with the reference input thereby creating undesirable video effects when switching between different video sources. To understand the problem, we examine a typical video application.

Supposing there is a desire to project a typical NTSC (National Television Standards Committee) video signal that arrives at 15,734.26573 Hertz Horizontal input frequency and 59.94 Hertz Vertical input frequency (also called the horizontal and vertical sync rates), on a 1024 by 768 resolution display screen. Where 1024 is the output horizontal resolution, and 768 is the output vertical resolution. Resolutions are specified in pixel counts and are usually refer to active display region. Therefore, 1024 by 768 comprise the active display area. In actuality, the total display area scanned includes a blanking area and in the case of a 1024 by 768 active display will be 1344 by 806 of total resolution. This total resolution is used to compute the desired clock rate (i.e. output frequency of the VCO). When the phase error between the reference and the VCO output is zero, the following equation applies:

$$\frac{\text{VCXO Freq}}{\text{Reference Divider}} = \frac{\text{VCO Output Frequency}}{\text{PLL Divider}}$$

The desired VCO output, that is the frequency required to lock the input and output frame rates, is the frequency required to read the entire output pixel data in the same frame as the input data. Therefore, VCO output is given by:

VCO Output=(Vert Input Freq)(Output Vert Res)(Output Hor Res)

Substituting and solving for the PLL divider value results in the following equation:

$$\text{PLL DIVIDER} = \frac{(\text{Vert Input Freq})(\text{Output Vert Res})(\text{Output Hor Res})}{(\text{VCXO Freq})/(\text{Reference Divider})}$$

Figure 4:
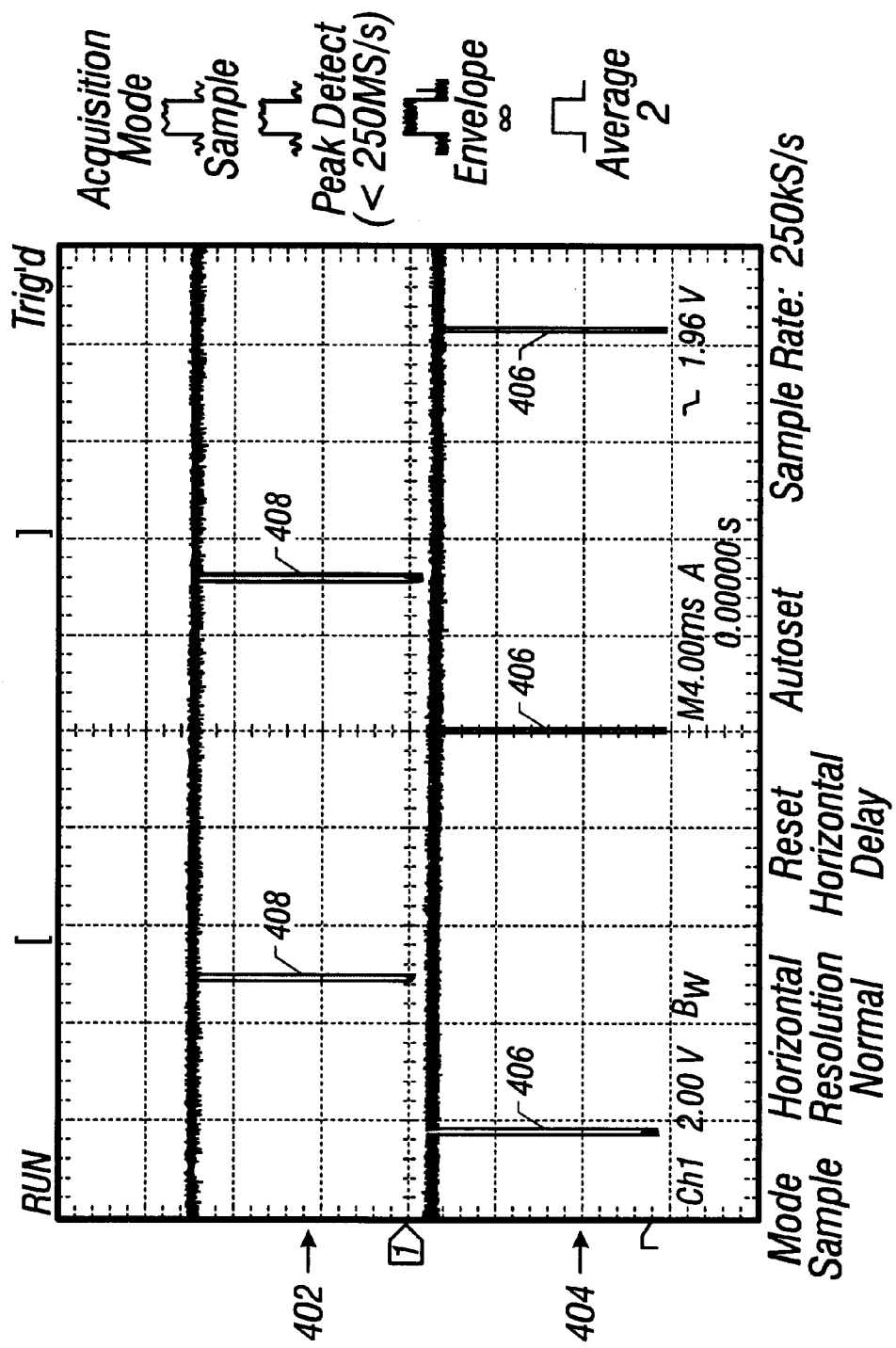
FIG. 4 is an attempted illustration of the input and output vertical sync pulse results when the output vertical sync pulse is not locked with the input vertical sync pulse.

Substituting a VCXO nominal frequency of 27,000,000 Hertz, and a reference divider of 1024 results in a value of 2462.562 for the PLL Divider, which is a non-integer number. As previously discussed, PLL Divider values are currently limited to integer values due to hardware limitations. Thus, the fractional part (i.e. 0.562) must be discarded resulting in a PLL Divider value of 2462. Back-calculating for the desired VCXO nominal frequency required to provide a lock results in 27,006,167.51 Hertz. Note that one can certainly manipulate the numbers to provide a non-fractional PLL divider. However, there are physical constraints like, for example, the reference divider must also be a positive integer number (even 1). Referring to FIG. 4, due to the inability to account for the fractional part of the PLL Divider, there is a relative motion between the output vertical sync pulse 406 and the input vertical sync pulse 408 because their frequencies are not locked. To lock in phase, both frequencies must be equal.

In general, the reference divider and the VCXO frequency are selected such that the output reference frequency (i.e. VCXO freq/Reference divider) is as low a frequency as possible for the PLL to lock on to and maintain low jitter. The output reference frequency cannot be too low because as the frequency decreases the PLL must have a higher PLL divider to compensate, which causes more jitter and less stability. Also, on the high end the output reference frequency is the smallest frequency step or change that can be made by the PLL because it can only multiply the frequency by integer numbers. This means the bigger the reference; the more off the PLL frequency could possibly be which would require higher adjustment to the VCXO to make up the difference. Currently technology limits VCXO's to the ±500 to ±1000 ppm range (parts per million). Those of ordinary skill will recognize that the present invention is not limited to use of VCXOs with this frequency range. Any VCXO with adjustable frequency may be used in practice.

The desire to switch between multiple video sources, formats, and to display a wide variety of user-selectable resolutions, makes it impossible to choose a fixed number for the reference frequency. The problem is that the number of pixel data that must be read between each vertical sync pulse is given by the vertical input frequency multiplied by the output vertical resolution and the output horizontal resolution. For our example case above, that number is 64,930,844.16. This is also the required frequency for the PLL output if all the display data is to be read within the vertical sync pulses. However, this number varies because the user may specify different resolutions and also because the input frequencies may vary depending on source and format.

Figure 7:
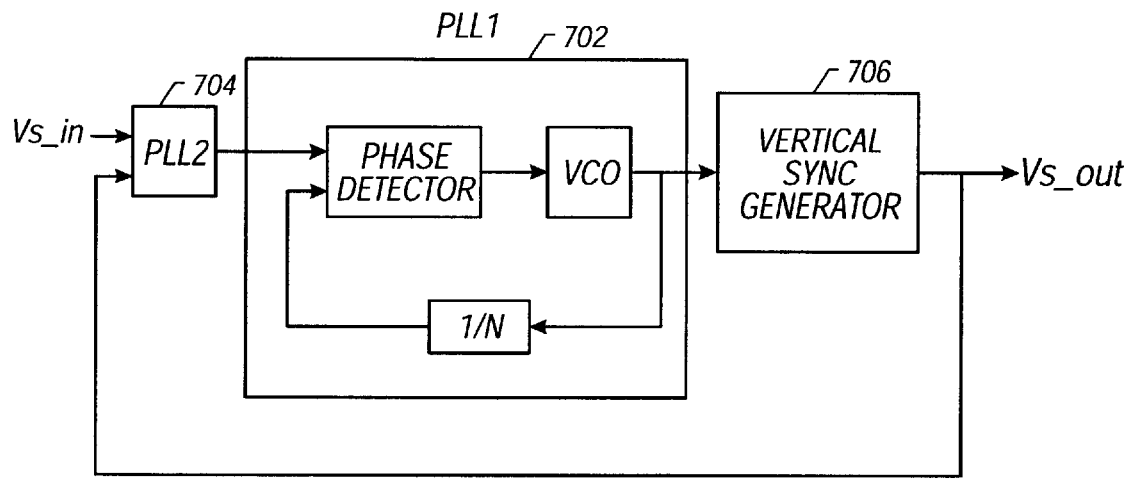
FIG. 7 is a block diagram of two Phase Lock Loops attached in series, in accordance with an embodiment of the present invention.

To provide consistent lock in the case where a user specifies different output resolutions, two Phase Lock Loops are attached in series as shown in FIG. 7. FIG. 7 is a block diagram of two Phase Lock Loops attached in series, in accordance with an embodiment of the present invention. The block 702, PLL1, is the original PLL and block 704, PLL2 is the additional PLL for accommodate the fractional part of the PLL Divider, as discussed above. The closest possible integer number (N) is used for the PLL Divider in the PLL block 702 to generate the pixel clock (output frequency), which feeds into the vertical sync generator, block 706, to generate the output vertical sync pulse (Vs_out). To account for the lost fractional part of the PLL Divider, a second Phase Locked Loop, block 704 is added in series to provide the necessary adjustment to the reference frequency and synchronize the output vertical sync pulse with the input vertical sync pulse (Vs_in). More detailed descriptions of the operation and contents of each block are provided below.

A single Phase Locked Loop may be used; however, the required output frequency (pixel clock) of more than 60 megahertz with an input reference of 60 Hertz would require a PLL Divider value of more than 1,000,000 which would make it difficult to stabilize the PLL loop, since every reference pulse would require over a million oscillator cycles. Therefore, using two Phase Lock Loops in series makes stabilization easier and more precise.

Figure 8:
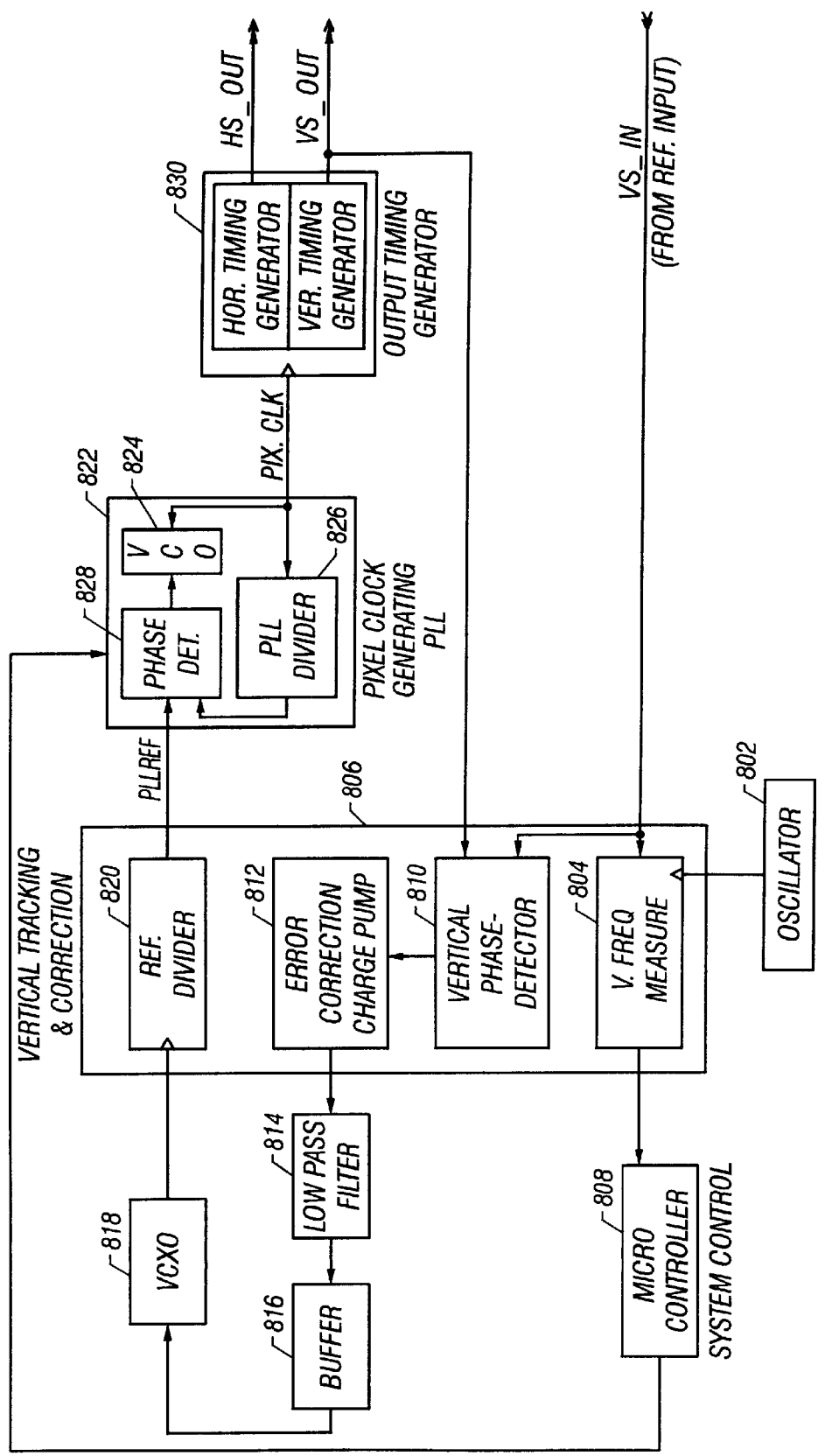
FIG. 8 is a block diagram of an embodiment of the present invention used to lock the input and output vertical sync rates.

Finally, to accommodate varying input frequencies, a means for measuring the incoming vertical sync frequency is added. A block diagram of an embodiment of the present invention used to lock the input and output vertical sync rates is shown in FIG. 8. To put the FIG. 8 diagram in the context of FIG. 7, the combination of blocks 810 through 818 is equivalent to PLL2 of FIG. 7, and the combination of blocks 820 and 822 is equivalent to PLL1 of FIG. 7.

Vertical Frequency Measure

Referring back to FIG. 8, in block 804 the input vertical sync rate (the reference rate) is measured to very accurate resolution using a high frequency free running oscillator 802. The output of vertical Frequency Measure block 804 is the number of counts per vertical. That is, block 804 counts how many pulses of the oscillator 802 occur between two input vertical sync pulses. For example, oscillator 804 having a frequency of 27,000,000 Hertz used on an NTSC vertical sync input of 59.94 Hertz will results in an output number of counts of 450,450 from block 804. The actual number is 27,000,000/59.94 which is 450,450.450, that is a non-integer value. Since only numbers of oscillator 802 pulses are counted, the fraction drops off, resulting in lost precision and further inability to lock. Therefore, it may be advantageous to use a faster oscillator. It is also desirable for the free running oscillator 802 and the VCXO 818 nominal frequency to be the same value to help minimize the calculations that the micro-controller must perform.

Micro-Controller Calculation

The output number of counts from block 804 is fed to the micro-controller block 808. In addition to its other functions, the micro-controller block 808 selects a reference divider 820 and performs all the calculations to compute the PLL Divider value that feeds into block 826 of PLL block 822. As discussed earlier, the reference divider 820 can be any positive integer value. The micro-controller computations are based on user selectable output horizontal frequencies, horizontal resolutions, and vertical resolutions. The selection may be accomplished through a user interface also controlled by the micro-controller. The only constraint is the vertical sync frequency, which must be the same on both the input and the output sides for the frames to lock.

In one embodiment of the invention, the micro-controller 808 may comprise a microprocessor manufactured by Motorola, such as one of the PowerPC family of processors, or a microprocessor manufactured by Intel, such as the 8031, 8051, 80×86, or Pentium family of processors, or a SPARC™ microprocessor from Sun Microsystems™, Inc. However, any other suitable microprocessor or microcomputer may be utilized.

Pixel Clock Generating Phase Locked Loop

The pixel clock generating PLL, block 822, generates the pixel clock rate required to read all the desired display data within the vertical sync period. For example, an NTSC video input at 59.94 Hz vertical sync frequency on a 1344 by 806 display requires a pixel clock rate of 64,930,844.16 Hertz.

The input to the pixel clock generating PLL is the output of the reference divider block 820, which receives its input from the VCXO block 818. The VCXO 818 starts at a nominal frequency, and is adjustable over certain range, usually between ±500 to ±1000 parts per million (ppm) with current technology. For example, a ±500 ppm adjustment range for a 27 MHz VCXO is equivalent to ±13,500 Hz (i.e. 500 times 27,000,000 divide by 1,000,000). Output of the reference divider, block 820, is compared with output of the PLL divider, block 826, in the Phase Detector, block 828, to generate the phase error between the two signals. The pixel clock output is generated by the Voltage Controlled Oscillator (VCO) block 824 which receives the filtered phase error. Filtering may be used to stabilize the Phase Locked Loop, as discussed earlier.

The pixel clock represents the rate at which video data is read from memory buffer. The pixel clock output is fed back through the PLL Divider block 826 to the phase detector block 828 for comparison with the reference. It is also fed into the Output Timing Generator, block 830, for generation of the horizontal and vertical sync pulses.

Output Timing Generator

The output horizontal and vertical sync pulses are computed in the Output Timing Generator (OTG) block 830. The OTG generates the output horizontal sync pulse (HS_OUT) by decoding a "horizontal sync start number" and a "horizontal sync end number" off the pixel counter based on the output format. The pixel clock clocks the pixel counter. The pixel counter resets to zero after counting to the required total number of pixels per line of output. By decoding different numbers for the "horizontal sync start number" and the "horizontal sync end number", the sync to video timing can be moved, thereby shifting or moving the picture on the output screen.

Figure 9:
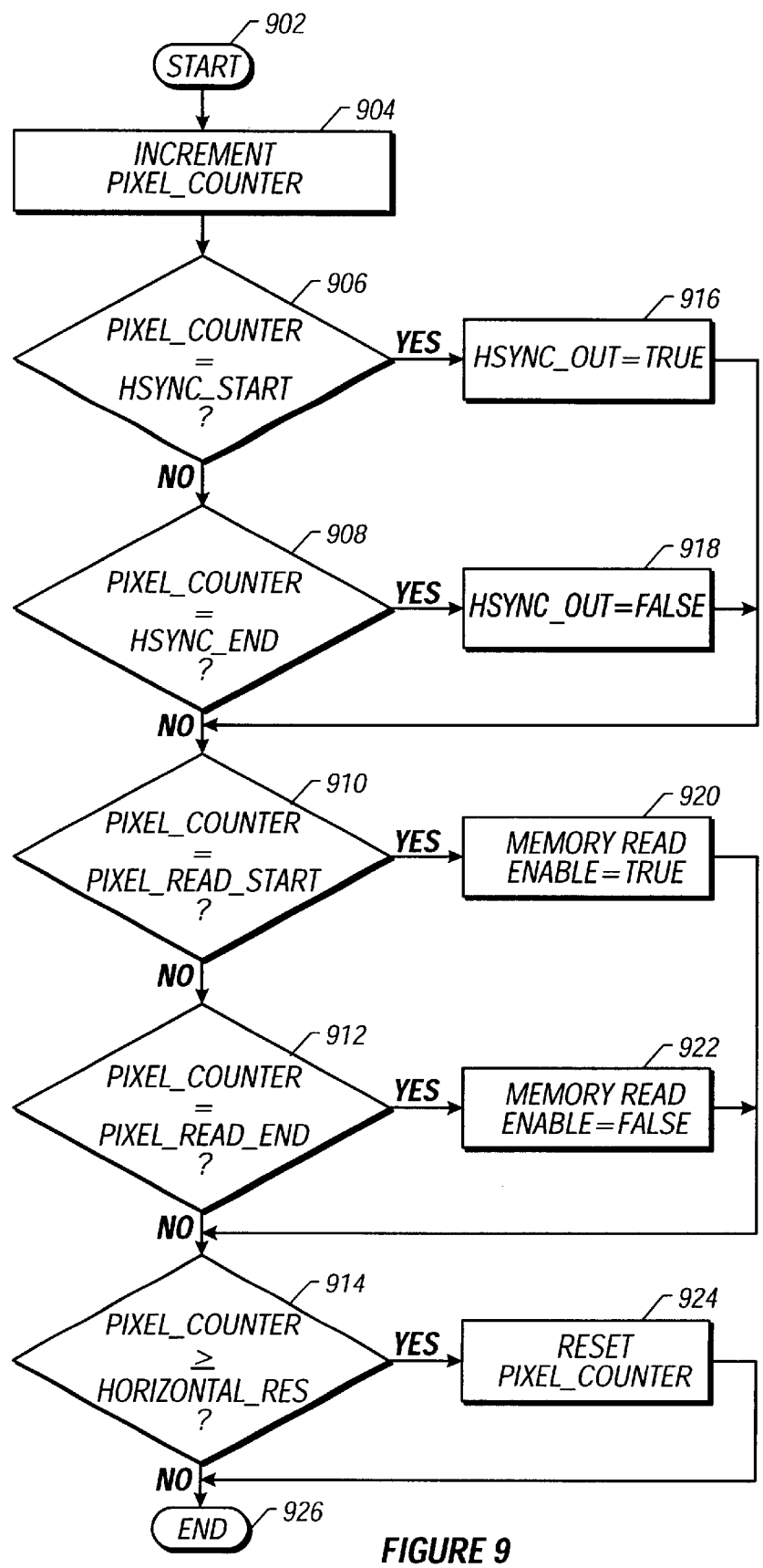
FIG. 9 is a flow diagram showing horizontal sync pulse generation in accordance with an embodiment of the present invention.

FIG. 9 is a flow diagram showing horizontal sync pulse generation in accordance with an embodiment of the present invention. FIG. 9 executes for every cycle of the pixel clock. At power-up, the pixel counter (Pixel_Counter), the output horizontal sync (Hsync_Out), and Memory Read Enable discretes may be reset. The horizontal sync start number (Hsync_Start), horizontal sync end number (Hsync_End), total number of pixels per line (Horizontal Res.), start count for memory buffer read (Pixel_Read_Start), and end count for memory buffer read (Pixel_Read_End) are written by the micro-controller into register buffers.

At entry into block 904 the pixel counter is incremented, if at block 906 the pixel counter value is equivalent to the horizontal sync start number, the output horizontal sync pulse is asserted at block 916, processing continues at block 910. However, if the pixel counter is not equivalent to the horizontal sync start number but is equivalent to the horizontal sync end number at block 908, then the output horizontal sync pulse is reset at block 918 and processing continues at block 910. For example, if the values of Hsync_Start=3 and Hsync_End=67, then Hsync_Out will be asserted at pixel count of 3 and reset at pixel count of 67.

At block 910, the pixel counter is compared with the start count for memory buffer read operation, if equivalent, memory read is enabled at block 920 and processing continues at block 914, otherwise, processing continues at block 912. At block 912, the pixel counter is compared with the end count for memory buffer read operation, if equivalent, memory read is disabled, at block 922 with processing continuing at block 914. The end count for memory buffer read should be equivalent to the start count for memory buffer read plus the desired output horizontal resolution (without blanking) less 1. For example, if the start count is 88 and the output resolution is 1024, then the end count will be 1111 of the pixel counter.

Finally, at block 914, the pixel counter is compared with the maximum output horizontal resolution (including blanking) and reset at block 924 if they are equivalent. The pixel counter should never be greater than the maximum output horizontal resolution. Processing terminates at block 926. This entire process is performed for every cycle of the pixel clock.

Figure 10:
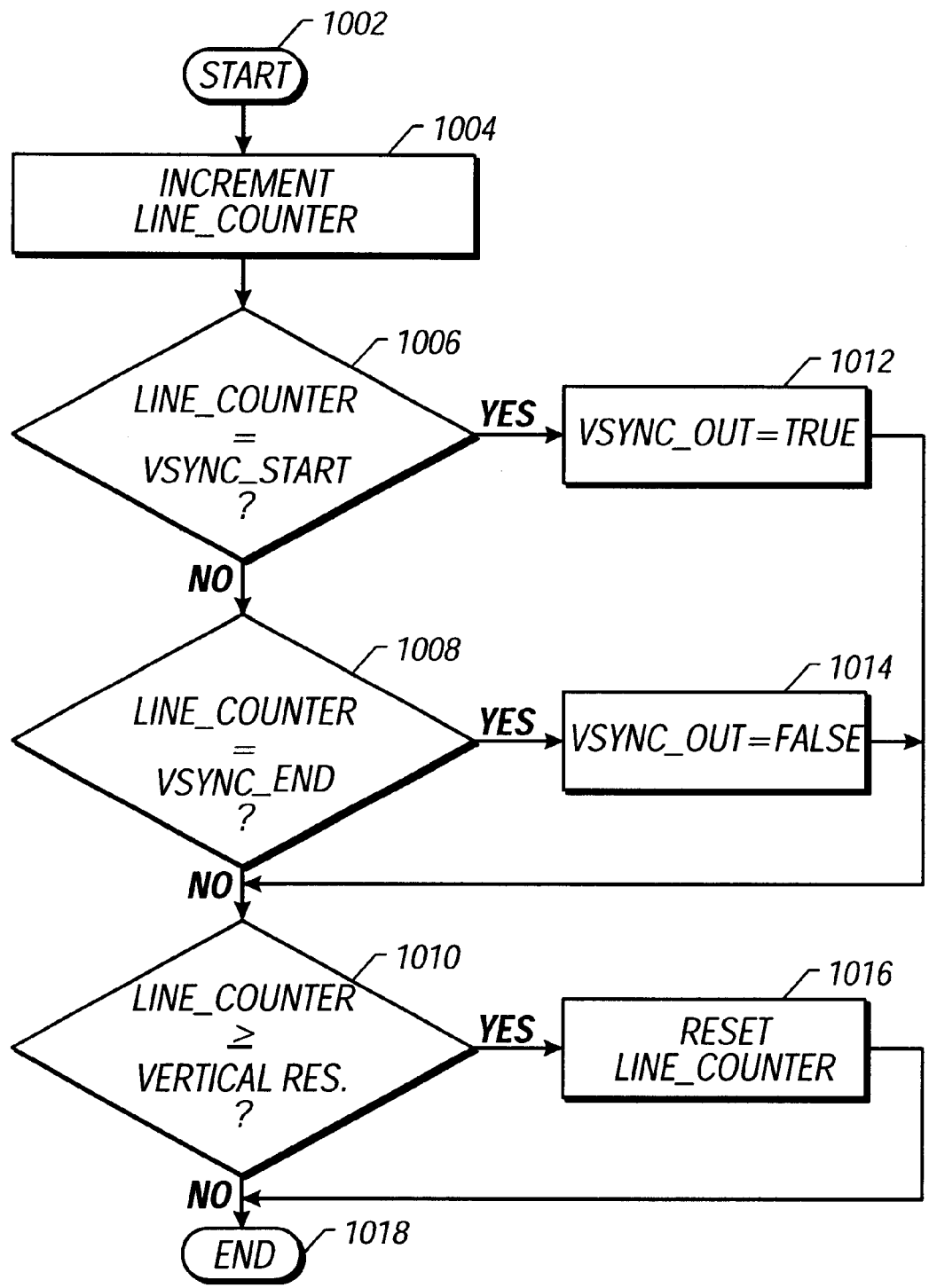
FIG. 10 is a flow diagram of generation of the output vertical pulse, in accordance with an embodiment of the invention.

The output vertical sync pulse is generated in the same way, as the output horizontal sync pulse described above, except that a line counter is used instead of a pixel counter to generate the sync pulse. The line counter is clocked by the output horizontal sync pulse (generated above) and reset by the required total number of lines per output frame. FIG. 10 is a flow diagram of generation of the output vertical pulse, in accordance with an embodiment of the invention. At power-up, the line counter (Line_Counter), and the output vertical sync (Vsync_Out) may be reset. The vertical sync start number (Vsync_Start), vertical sync end number (Vsync_End), and total number of lines per frame (Vertical Res) are written by the micro-controller into register buffers.

At entry into block 1004 the line counter is incremented, if at block 1006 the line counter value is equivalent to the vertical sync start number, the output vertical sync pulse is asserted at block 1012, processing continues at block 1008. However, if the pixel counter is not equivalent to the vertical sync start number but is equivalent to the vertical sync end number at block 1008, then the output vertical sync pulse is reset at block 1014 and processing continues at block 1010. For example, if the values of Vsync_Start=3 and Vsync_End=8, then Vsync_Out will be asserted at line count of 3 and reset at line count of 8.

Finally, at block 1010, the line counter is compared with the maximum output vertical resolution (including blanking and reset at block 1016 if they are equivalent. The line counter should never be greater than the maximum output vertical resolution per frame. Processing terminates at block 1018. This entire process is performed for every cycle of the output horizontal sync signal computed above.

This architecture makes the delay between the video input and the output picture adjustable because the user may set desired values for the constants used in the processes of FIGS. 9 and 10 via a user interface. Video delay (or time skew) adjustment requires selecting any point in the output frame to be the locking point for the input vertical sync pulse. In an embodiment, a separate signal is generated off the line counter and fed back to the vertical phase detector, 810, to allow movement of the locking point without changing the output vertical sync. This separate signal is the same frequency as the output vertical sync, but may be skewed in phase.

Figure 11:
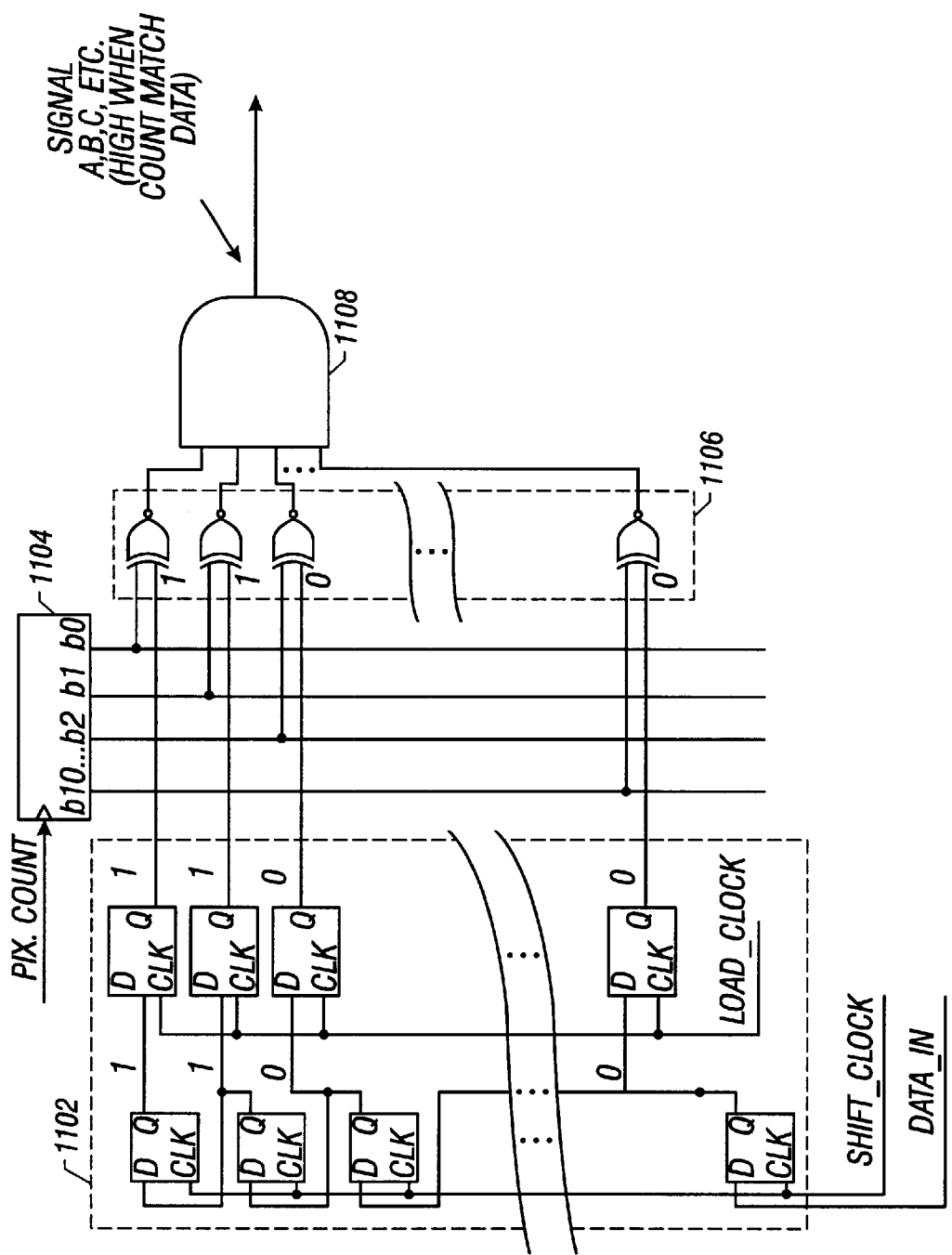
FIG. 11 is a logic diagram of a micro-controller programmable output timing generator for the horizontal sync pulse showing the logic gates of the generator, in accordance with an embodiment of the invention.
Figure 12:
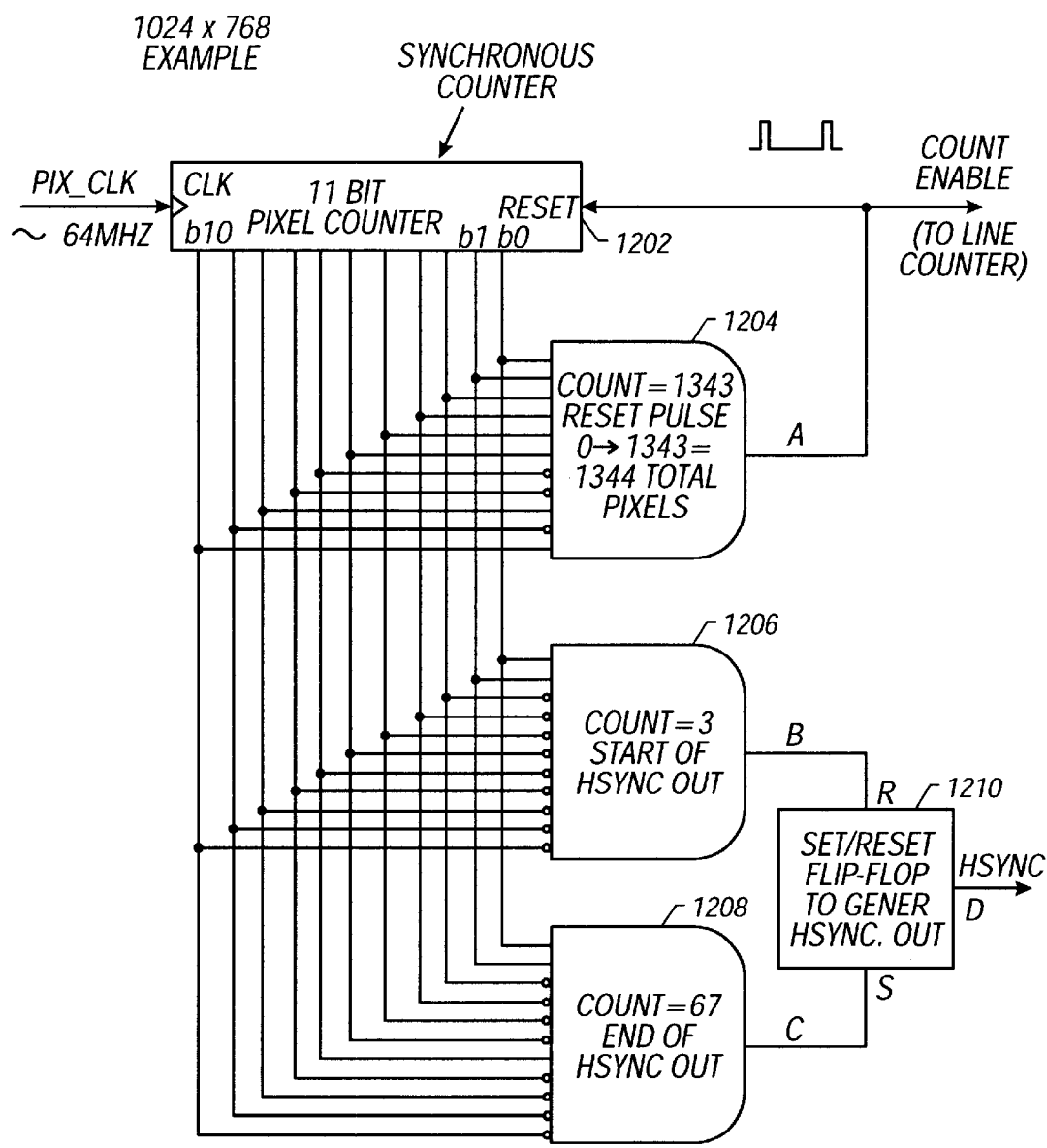
FIG. 12 is a logic diagram of the output timing generator for the horizontal sync pulse showing the logic gates of the generator programmed for a 1024 by 768 (i.e. 1344 by 806 total) output, in accordance with an embodiment of the invention.
Figure 12:
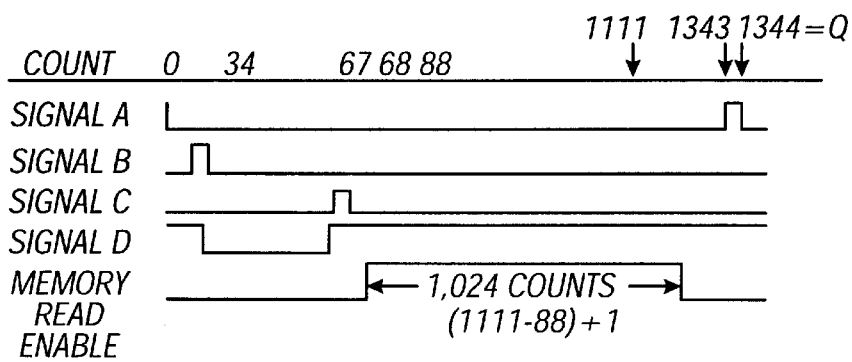

In one or more embodiments of the present invention, the Output Timing Generator can be represented using logic gates as shown in FIGS. 11 and 12 using. Both the horizontal and vertical sync pulses may be generated using the logic described in FIGS. 11 and 12, however; in the example below, only the horizontal sync pulse is generated. In FIG. 11 a set of Q Flip-Flop pairs 1102 (up to the number of bits in the pixel counter) hold the binary representation of the number to decode. For example, the number being decoded could be the Horizontal Sync start number, or the end number. Outputs of the Q Flip-Flops are equivalenced in block 1106 with the binary representation of the pixel count 1104. When all the bits are equivalent, output of the AND-gate 1108 is asserted.

FIG. 12 shows an example of decoding the horizontal sync and reset pulses for a 1024 by 768 (i.e. 1344 by 806 total) output resolution. Block 1202 contains the binary representation of the pixel counter. Outputs of block 1202 are passed thorough logic blocks 1204 through 1208 to determine the pixel counter reset pulse at block 1204, start of the output horizontal sync pulse at block 1206, and the end of the horizontal sync pulse at block 1208. When the pixel counter reset pulse is asserted, the pixel counter block 1202 is reset to zero.

The Set/Reset Flip-Flop block 1210 asserts the sync pulse by resetting the flip-flop 1210 (output D) when output of start of horizontal sync out block 1206 (output B) is asserted.

The sync pulse is reset (i.e. no longer asserted) when output of the end of horizontal sync out block 1208 (output C) is asserted by setting the flip-flop.

Vertical Tracking and Correction

As discussed earlier, errors may accumulate from measuring the incoming vertical sync and also in the computation of the PLL Divider value used in block 826. These errors are due to losses associated with discarding the fractional component from the computation of the PLL Divider value, which is currently implemented as an integer divider. In the earlier example, the PLL Divider was rounded off to the integer value of 2462 instead of the required 2462.562 for a 27 MHz oscillator, sampling an NTSC 59.94 Hz vertical input, for a desired output display area of 1344 by 806 pixels. Also, the number of counts per vertical measured at block 804 was rounded off to the integer value because fractional parts cannot be measured. The result is the inability to lock the input and output vertical sync pulses.

Figure 13:
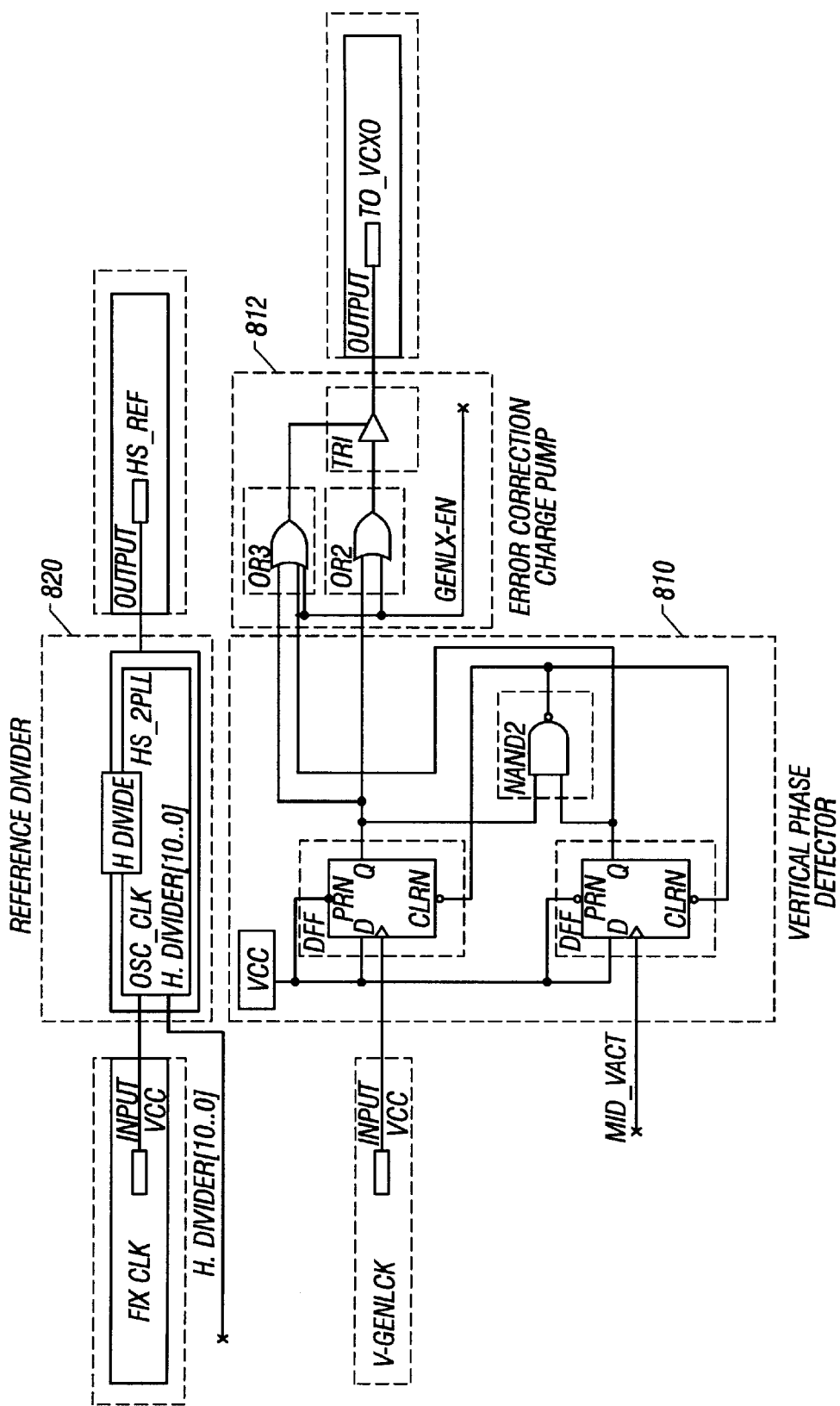
FIG. 13 is a logic diagram showing the reference divider, vertical phase detector, and the error correction charge pump, in accordance with an embodiment of the invention.

To correct the problem associated with the inability to lock, a second PLL circuitry comprising blocks 810 through 818 is coupled in series with the pixel clock generating PLL. In one embodiment, the reference divider block 820, vertical phase detector block 810, and the error correction charge pump block 812 are shown more elaborately in FIG. 13. The phases of the input and output vertical sync pulses are compared in the vertical phase detector circuitry, 810. The output of the phase detector is passed to charge pump 812, which generates a logic level pulsed waveform.

The error correction charge pump, 812, generates a digital output signal that is a pulse as wide as the phase error between the input vertical sync pulse and output vertical sync pulse. Output of the error correction charge pump 812 is filtered in low-pass filter block 814. The low pass filter stabilizes the loop and generates a "DC" voltage error from the pulsed error correction charge pump 810 output. The output of the low-pass filter may be buffered at block 816 to create a low impedance drive for the VCXO (i.e. if a low impedance VCXO is used) as needed. The output of the buffer is a constant voltage input to the VCXO, block 818. The VCXO, block 818, adjusts its output frequency according forcing the output and input vertical syncs (VS_OUT and VS_IN) to lock. The resulting VCXO nominal frequency will be such that synchronization occurs between the input vertical sync and the output vertical sync, as shown in FIG. 5.

Figure 5:
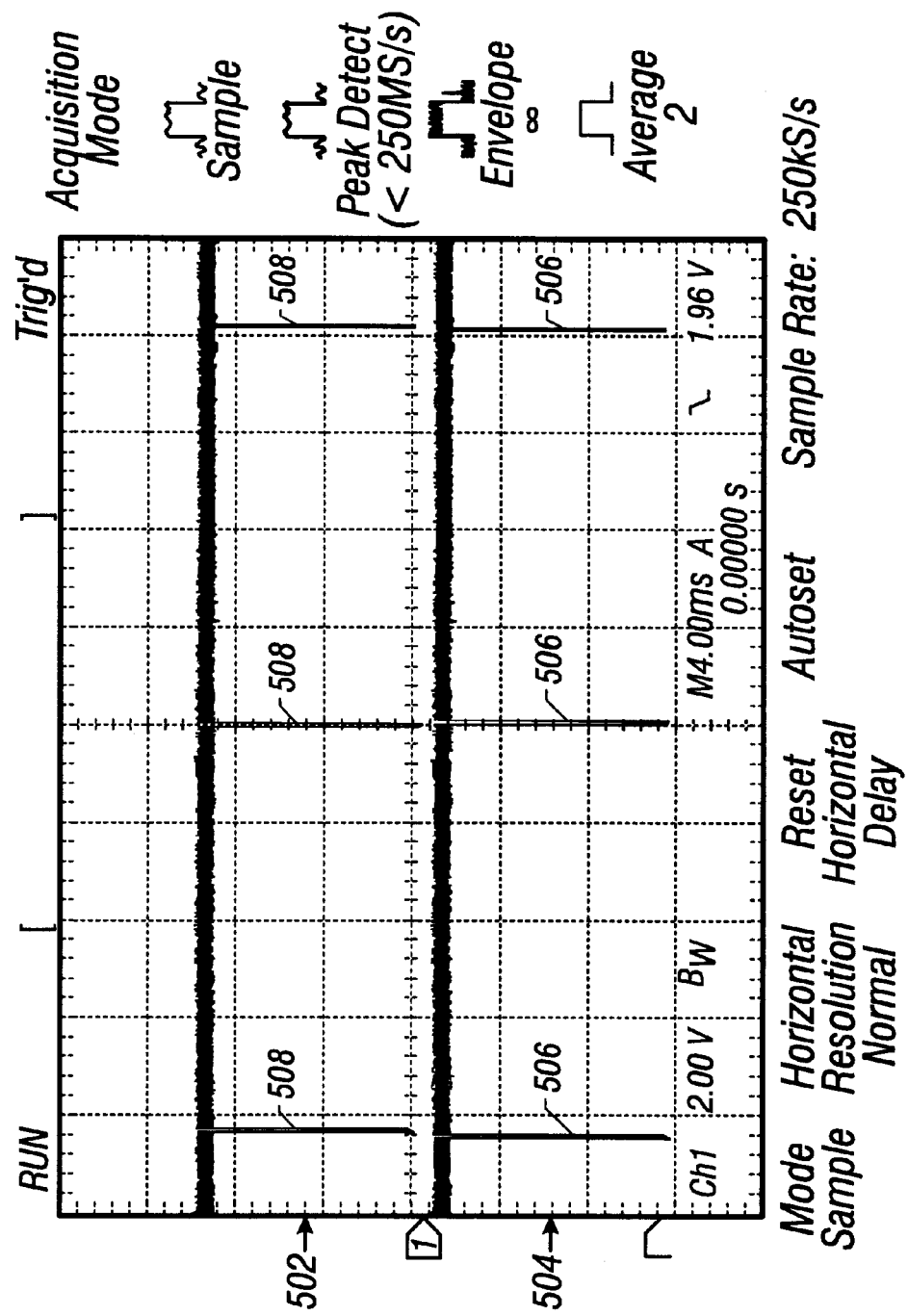
FIG. 5 is an illustration of the input and output vertical sync pulse results when the output vertical sync pulse is locked in phase with the input vertical sync pulse, according to an embodiment of the present invention.

FIG. 5 is an illustration of the input and output vertical sync pulse results when the output vertical sync pulse is locked in frequency with the input vertical sync pulse and there is no phase shift between both signals, according to an embodiment of the present invention. In FIG. 5, the top trace shows the vertical sync of the input signal 502. The bottom trace shows the vertical sync of the output signal 504. In accordance with an embodiment of the present invention, both traces (output 506 and input sync 508) have the same frequency content but may be shifted in phase (user may select desired phase shift). In the FIG. 5 depiction, there is no phase shift hence, when viewed on an oscilloscope; both traces, sync output pulse 506 and input sync pulse 50, would appear to move together (i.e., locked).

The frequency that will result in an integer number for the PLL Divider is the value required to lock the input and output vertical pulses. This frequency is provided by the VCXO and is given by the equation:

$$\text{VCXO Lock Freq} = \frac{(\text{Vert Input Freq})(\text{Output Vert Res})(\text{Output Hor Res})}{(\text{PLL DIVIDER})/(\text{Reference Divider})}$$

Substituting the numbers from the previous NTSC example, as shown below, results in a VCXO lock frequency of 27,006,167.51 Hertz for the input vertical sync and the output vertical sync pulses to lock.

$$\text{VCXO Lock Frequency} = \frac{(59.94)(806)(1344)}{(2462)/(1024)}$$

Substituting back into the PLL divider equation yields an integer number for the PLL Divider as follows:

$$\text{PLL DIVIDER} = \frac{(59.94)(806)(1344)}{(27,006,167.51)/(1024)} = 2462$$

The above examples show that the second PLL enables phase locking of the input vertical sync and the output vertical sync pulses by adjusting the VCXO frequency, which is the reference frequency to the pixel clock generating PLL. In general, locking will occur when the PLL Divider equation results in an integer number.

Applications

Due to the present invention's ability to lock output and input vertical sync pulses, embodiments of the invention can be used with various digital and analog circuitry and devices (including those with interlaced/non-interlaced input & output) such as those providing: switching, graphics switching, seamless graphics switching, scan conversion, scaling, video scaling, line doubling, line quadrupling, other various circuits and devices that have an input at one resolution with one vertical rate and output a different resolution and/or different vertical rate. Further, the invention can be used to improve various other systems as appropriate.

In fact, great benefit is derived at large staging events, from incorporation of the invention into scalers having video input and computer rate outputs that are a different frequency than the input.

Although the invention may be applied where TV signals are up-converted to computer line rates, it is also beneficial to systems related to down-converting computer graphic signals to television signals. For instance, so that an image generated by a computer can be put into a video tape recorded presentation or report.

The invention is also applicable to the film and movie industry. For instance equipment involved in producing special effects, high resolution graphics, computer generated images, high tech graphics, computer graphics. Because movie film is typically shot at 24 frames per second, but much of the incorporated television and computer video is running at a different frame rates, it is difficult to produce an output with all the different frame rates "locked up" so when a picture is generated using a film camera, bars are not displayed floating through the pictures on the monitors.

An additional application of the invention is in broadcasting. Broadcast switchers and image controllers for broadcast studios require seamless switching because of the multiple input signals used. For instance, broadcasts often include added graphics and/or video. Improved switching can also be provided by the invention for the security or home theater market.

Thus, methods and apparatus for vertically locking input and output signals from differing video sources have been described. Although the present invention has been described with respect to certain specific embodiments, it will be clear to those skilled in the art that the inventive features of the present invention are applicable to other embodiments as well, all of which are intended to fall within the scope of the present invention.

What is claimed is:

1. A method for vertically locking input and output signals comprising:

obtaining a continuous input video signal having an input vertical sync frequency;

generating a first divider value from said continuous input video signal, said first divider value being a positive integer number;

generating a reference frequency using a first frequency generator having a first adjustable output with a nominal frequency greater than zero, wherein said reference frequency is adjustable by adjusting said first adjustable output of said first frequency generator about said nominal frequency using an adjustment signal;

generating a pixel clock frequency from said reference frequency using said first divider value;

generating an output vertical sync frequency from said pixel clock frequency; and adjusting said reference frequency to obtain a lock between said input vertical sync frequency and said output vertical sync frequency by generating said adjustment signal from an error between said input vertical sync frequency and said output vertical sync frequency.

2. The method of claim 1, wherein said input vertical sync frequency is indicated by a vertical sync pulse occurring at said input vertical sync frequency thus having a plurality of input vertical sync pulses in said continuous input video signal.

3. The method of claim 2, wherein said input vertical sync frequency is determined by counting a number of pulses of a free running oscillator occurring between two adjacent input vertical sync pulses of said plurality of input vertical sync pulses, wherein said free running oscillator has a frequency equal to said nominal frequency of said first frequency generator.

4. The method of claim 1, wherein said reference frequency is generated by dividing said first adjustable output of said first frequency generator by a second divider value, wherein said second divider value is a positive integer number.

5. The method of claim 4, wherein said generating said first divider value from said continuous input video signal comprises:

obtaining a desired video output vertical resolution;

obtaining a desired video output horizontal resolution; and generating an intermediate value by dividing a product of said input vertical sync frequency, said desired video output horizontal resolution, said desired video output vertical resolution, and said second divider value, by said nominal frequency, said intermediate value having an integer portion and a fractional portion;

setting said first divider value to said integer portion of said intermediate value.

6. The method of claim 1, wherein said generating said pixel clock frequency comprises:

generating said pixel clock frequency using a second frequency generator having a second adjustable output with a nominal frequency equal to zero, said second frequency generator using an input error signal to generate said second adjustable output, wherein said second adjustable output is said pixel clock frequency; and generating said error signal by comparing said reference frequency with an intermediate frequency generated by dividing said pixel clock frequency by said first divider value.

7. The method of claim 6, wherein said error signal is further filtered before being passed to said second frequency generator.

8. The method of claim 1, wherein said generating said output vertical sync frequency comprises:

obtaining a desired video output horizontal resolution and a desired video output vertical resolution;

generating a pixel counter by counting cycles of said pixel clock;

generating an output horizontal sync frequency from said pixel counter;

generating a line counter by counting cycles in said output horizontal sync frequency;

generating said output vertical sync frequency from said line counter;

restarting said pixel counter when said pixel counter reaches said desired video output horizontal resolution; and restarting said line counter when said line counter reaches said desired video output vertical resolution.

9. The method of claim 8, wherein a user provides said desired video output horizontal resolution and said desired video output vertical resolution, and wherein said desired video output horizontal resolution and said desired video output vertical resolution have pixels required for blanking.

10. The method of claim 8, wherein said generating said output horizontal sync frequency comprises:

asserting a horizontal sync pulse when said pixel counter is equivalent to a user programmable horizontal sync start number; and resetting said horizontal sync pulse when said pixel counter is equivalent to a user programmable horizontal sync end number.

11. The method of claim 8, wherein said generating said output vertical sync frequency comprises:

asserting a vertical sync pulse when said line counter is equivalent to a user programmable vertical sync start number; and resetting said vertical sync pulse when said line counter is equivalent to a user programmable vertical sync end number, wherein said start number and said end number may be adjusted to cause phase shift between said input vertical sync pulse and said output vertical pulse.

12. An apparatus for vertically locking input and output signals comprising:

a continuous input video signal having an input vertical sync frequency;

means for generating a first divider value from said continuous input video signal, said first divider value being a positive integer number;

a first frequency generator for generating a reference frequency, said first frequency generator having a first adjustable output with a nominal frequency greater than zero, wherein said reference frequency is adjustable by adjusting said first adjustable output of said first frequency generator about said nominal frequency using an adjustment signal;

a second frequency generator for generating a pixel clock frequency from said reference frequency using said first divider value;

means for generating an output vertical sync frequency from said pixel clock frequency; and means for generating said adjustment signal from an error between said input vertical sync frequency and said output vertical sync frequency, wherein said adjustment signal is used for adjusting said reference frequency until a lock is obtained between said input vertical sync frequency and said output vertical sync frequency.

13. The apparatus of claim 12, wherein said input vertical sync frequency is indicated by a vertical sync pulse occurring at said input vertical sync frequency thus having a plurality of input vertical sync pulses in said continuous input video signal.

14. The apparatus of claim 13, wherein said input vertical sync frequency is determined by counting a number of pulses of free running oscillator occurring between two adjacent input vertical sync pulses of said plurality of input vertical sync pulses, wherein said free running oscillator has a frequency equal to said nominal frequency of said first frequency generator.

15. The apparatus of claim 12, wherein said reference frequency is generated by dividing said first adjustable output of said first frequency generator by a second divider value, wherein said second divider value is a positive integer number.

16. The apparatus of claim 15, wherein said generating said first divider value from said continuous input video signal comprises:

obtaining a desired video output vertical resolution;

obtaining a desired video output horizontal resolution; and generating an intermediate value by dividing a product of said input vertical sync frequency, and desired video output horizontal resolution, said desired video output vertical resolution, and said second divider value, by said nominal frequency, said intermediate value having an integer portion and a fractional portion;

setting said first divider value to said integer portion of said intermediate value.

17. The apparatus of claim 12, wherein said second frequency generator uses an error signal to generate a second adjustable output with a nominal frequency equal to zero, said second adjustable output being said pixel clock frequency, and said generating said pixel clock frequency comprising:

generating said error signal by comparing said reference frequency with an intermediate frequency generated by dividing said pixel clock frequency by said first divider value.

18. The apparatus of claim 17, wherein said error signal is further filtered before being passed to said second frequency generator.

19. The apparatus of claim 12, wherein said generating said output vertical sync frequency comprises:

obtaining a desired video output horizontal resolution and a desired video output vertical resolution;

generating a pixel counter by counting cycles of said pixel clock;

generating an output horizontal sync frequency from said pixel counter;

generating a line counter by counting cycles in said output horizontal sync frequency;

generating said output vertical sync frequency from said line counter;

restarting said pixel counter when said pixel counter reaches said desired video output horizontal resolution; and restarting said line counter when said line counter reaches said desired video output vertical resolution.

20. The apparatus of claim 19, wherein a user provides said desired video output horizontal resolution and said desired video output vertical resolution, and wherein said desired video output horizontal resolution and said desired video output vertical resolution have pixels required for blanking.

21. The apparatus of claim 19, wherein said generating said output horizontal sync frequency comprises:

asserting a horizontal sync pulse when said pixel counter is equivalent to a user programmable horizontal sync start number; and resetting said horizontal sync pulse when said pixel counter is equivalent to a user programmable horizontal sync end number.

22. The apparatus of claim 19, wherein said generating said output vertical sync frequency comprises:

asserting a vertical sync pulse when said line counter is equivalent to a user programmable vertical sync start number; and resetting said vertical sync pulse when said line counter is equivalent to a user programmable vertical sync end number, wherein said start number and said end number may be adjusted to cause a phase shift between said input vertical sync pulse and said output vertical pulse.

23. The apparatus of claim 12, wherein said means for generating said first divider value is a system comprising:

a processing unit; and a memory device.

24. The apparatus of claim 12, wherein said means for generating said output vertical sync frequency is a system comprising:

a processing unit; and a memory device.

25. The apparatus of claim 12, wherein said first frequency generator is is voltage controlled crystal oscillator.

26. The apparatus of claim 12, wherein said second frequency generator is a voltage controlled oscillator.

27. An apparatus for vertically locking input and output signals comprising:

a continuous input video signal having an input vertical sync frequency;

a micro-controller for generating a first divider value from said continuous input video signal, said first divider value being a positive integer number;

a voltage controlled crystal oscillator for generating a reference frequency, said voltage controlled oscillator having a first adjustable output with a nominal frequency greater than zero, wherein said reference frequency is adjustable by adjusting said first adjustable output of said voltage controlled crystal oscillator about said nominal frequency using an adjustment signal;

a phase locked looped for generating a pixel clock frequency, said phase locked loop generating an error signal by comparing in a phase detector said reference frequency with an intermediate frequency generated by dividing said pixel clock frequency by said first divider value and using said error signal as input to a voltage controlled oscillator to generate said pixel clock frequency;

a computer for generating an output vertical sync frequency from said pixel clock frequency; and means for generating said adjustment signal from said input vertical sync frequency and said output vertical sync frequency, wherein said adjustment signal is used for adjusting said reference frequency until a lock is obtained between said input vertical sync frequency and said output vertical sync frequency.

* * * * *

UNITED STATES PATENT AND TRADEMARK OFFICE
CERTIFICATE OF CORRECTION

PATENT NO.    : 6,441,658 B1
DATED         : August 27, 2002
INVENTOR(S)   : Taraci et al.

It is certified that error appears in the above-identified patent and that said Letters Patent is hereby corrected as shown below:

Column 1,
Line 17, the word "Switches" should read -- Switchers --
Line 22, the word "switches" should read -- switchers --
Line 34, the word "seemless" should read -- seamless --
Line 51, the word "original" should read -- originate --

Column 6,
Line 55, after "read pointer" the word -- are -- should be inserted

Column 10,
Line 64, "." should be removed and "Because" should be lowercase

Column 12,
Line 30, "." should be -- , -- and "Where" should be lowercase
Line 33, after the word "and" the word "are" should be deleted
Line 34, the word "comprise" should read -- comprises --

Column 14,
Line 18, the word "results" should read -- result --
Line 20, the words "that is" should be deleted
Line 63, the word "devide" should read -- devided --

Column 17,
Line 43, the word "according" should be deleted

UNITED STATES PATENT AND TRADEMARK OFFICE
CERTIFICATE OF CORRECTION

PATENT NO.   : 6,441,658 B1
DATED        : August 27, 2002
INVENTOR(S)  : Taraci et al.

It is certified that error appears in the above-identified patent and that said Letters Patent is hereby corrected as shown below:

Column 18,
Line 38, betweeen "output" and "a" the word -- at -- should be inserted Signed and Sealed this Sixth Day of May, 2003

JAMES E. ROGAN
*Director of the United States Patent and Trademark Office*